United States Patent [19]

Sawayama et al.

[11] Patent Number: 5,428,249
[45] Date of Patent: Jun. 27, 1995

[54] PHOTOVOLTAIC DEVICE WITH IMPROVED COLLECTOR ELECTRODE

[75] Inventors: Ippei Sawayama, Machida; Hitoshi Toma, Kawasaki; Yoshihiko Hyosu, Machida; Tatsuo Fujisaki, Nagahama; Toshihiko Mimura, Nara, all of Japan

[73] Assignee: Canon Kabushiki Kaisha, Tokyo, Japan

[21] Appl. No.: 89,585

[22] Filed: Jul. 12, 1993

[30] Foreign Application Priority Data

| Jul. 15, 1992 | [JP] | Japan | 4-210754 |
| Aug. 20, 1992 | [JP] | Japan | 4-221683 |
| Oct. 13, 1992 | [JP] | Japan | 4-273972 |
| Dec. 28, 1992 | [JP] | Japan | 4-347456 |

[51] Int. Cl.⁶ .................................. H01L 23/48
[52] U.S. Cl. ............................... 257/746; 257/753; 257/772; 136/256
[58] Field of Search .......... 257/772, 746, 753, 762, 257/769, 779; 136/256

[56] References Cited

U.S. PATENT DOCUMENTS

| 3,839,727 | 10/1974 | Herdzik et al. | 257/772 |
| 4,256,513 | 3/1981 | Yoshida et al. | 136/256 |
| 4,342,796 | 8/1982 | Brown et al. | 427/136 |
| 4,486,232 | 12/1984 | Nakatani et al. | 75/252 |
| 4,877,460 | 10/1989 | Flödl | 136/244 |
| 5,074,920 | 12/1991 | Gonsiorawski et al. | 136/244 |
| 5,084,107 | 1/1992 | Deguchi et al. | 136/256 |
| 5,151,373 | 9/1992 | Deguchi et al. | |
| 5,178,685 | 1/1993 | Borenstein et al. | 136/244 |
| 5,268,039 | 12/1993 | Vogeli et al. | 257/436 |
| 5,281,684 | 1/1994 | Moore et al. | 427/96 |
| 5,317,191 | 5/1994 | Abe | 257/772 |

FOREIGN PATENT DOCUMENTS

| 2647960 | 12/1990 | France | H01L 23/49 |
| 57-5066 | 1/1982 | Japan | H01L 31/18 |
| 61-59549 | 12/1986 | Japan | H01L 31/04 |
| 61-59551 | 12/1986 | Japan | H01L 31/04 |
| 62-8958 | 2/1987 | Japan | H01L 31/04 |
| 63-11791 | 3/1988 | Japan | H01L 31/04 |
| 2-3553 | 1/1990 | Japan | H01L 29/46 |
| 2-3554 | 1/1990 | Japan | H01L 29/46 |
| 2-3555 | 1/1990 | Japan | H01L 29/46 |
| 2-281742 | 11/1990 | Japan | 257/772 |
| 3-18041 | 1/1991 | Japan | 257/772 |

OTHER PUBLICATIONS

IEEE Trans. on Elect. Deve., vol. 37, No. 3, Mar. 1990, by Baert et al., "Amorphous-Silicon Solar Cells with Screen-Printed Metallization".

Primary Examiner—Jerome Jackson
Assistant Examiner—Courtney A. Bowers
Attorney, Agent, or Firm—Fitzpatrick, Cella, Harper & Scinto

[57] ABSTRACT

A photovoltaic device of this invention has a semiconductor layer for generating a photovoltaic power and a collector electrode formed on the semiconductor layer to collect the power generated by the semiconductor layer. A conductive layer containing a conductive powder is formed on at least one side of the collector electrode closer to the semiconductor layer, and a metal layer is formed on the side away from the semiconductor layer. The metal layer covers the surface of the conductive layer away from the semiconductor layer.

16 Claims, 17 Drawing Sheets

PHOTOVOLTAIC DEVICE WITH IMPROVED COLLECTOR ELECTRODE

BACKGROUND OF THE INVENTION

1. Field of the Invention

The present invention relates to an electrode of a semiconductor device and, more particularly, to a photoelectric converting device having a collector electrode which causes lesser deterioration with time, has a low resistance, and can be made thick.

2. Related Background Art

A photoelectric converting device is a semiconductor device known as a photosensor, a photoelectric cell, or a solar cell, which is an energy generating device using the photovoltaic power of a semiconductor.

To alleviate an energy crisis caused by an insufficient energy supply power due to a recent abruptly increasing demand for energy or to mitigate a global environmental disruption by a warming phenomenon resulting from a greenhouse effect caused by an increase in carbon dioxide quantity, an energy supply source which is less harmful to environment has been desired.

In particular, a photoelectric converting device (which will include a photovoltaic device and a solar cell hereinafter) which is clean, has a high safety, and can supply energy permanently for extended periods of time is considered most prominent as a novel energy supply source that can meet the above requirement.

Well-known examples of the photovoltaic device are as follows.

(1) Crystal-based solar cell

A crystal-based solar cell is manufactured by forming a p-n junction by doping an n-type or p-type impurity into a p-type or n-type single-crystal or polycrystalline wafer.

(2) Amorphous silicon-based solar cell

An amorphous silicon-based solar cell is manufactured by decomposing monosilane gas or disilane gas by using, e.g., heat, an RF electric field, or light, thereby producing and depositing a-Si or the like.

In this case, an amorphous silicon-based solar cell with a pin structure is formed by forming a p-type semiconductor and an n-type semiconductor by doping a gas, such as $B_2H_6$ or $BF_3$, as a p-type dopant and $PH_3$ as an n-type dopant simultaneously with monosilane or disilane.

(3) Compound semiconductor solar cell

A compound semiconductor solar cell is a GaAs solar cell manufactured by forming a p-n structure by growing p-type GaAs on n-type GeAs by liquid-phase epitaxial growth.

A solar cell in which a p-n structure is formed by stacking and calcining n-type CdS and p-type CdTe is also a compound semiconductor solar cell.

In addition to the above solar cells, a $CuInSe_2$ solar cell and an n-type CdS/p-type $CuInS_2$ solar cell are usable as photovoltaic devices. These photovoltaic devices aim at efficiently extracting an incident optical energy as an electrical energy through a collector electrode.

To obtain a photovoltaic device with a high conversion efficiency, therefore, the following two points are important.

(1) To increase the efficiency of conversion from an optical energy to an electrical energy.

(2) To form a collector electrode with a lower electrical resistance for the purposes of decreasing a Joule loss by decreasing the electrical resistance at the collector electrode in collecting an electrical energy through the collector electrode and of reducing blocking of light by the collector electrode.

The following two methods are known as a method of forming a collector electrode.

One is a method of forming a collector electrode by vapor-depositing a conductive metal, as disclosed in Japanese Patent Publication No. 57-5066.

The other is a method of forming a collector electrode by printing and calcining a conductive paste prepared by binding a conductive powder using glass or a polymer.

In particular, the method using a conductive paste as a collector electrode is one of techniques which can easily form large-area devices through a simple manufacturing process and are therefore expected to have a surprising effect of reducing the manufacturing cost.

At the present, however, collector electrodes manufactured by these conventional methods have a problem of a decrease in conversion efficiency or an inability to sufficiently achieve a stable operation over long periods of time resulting from the following respects.

(1) The electrical resistance of a collector electrode itself is relatively high, leading to an increase in Joule loss, and this increases the loss of a conversion efficiency.

(2) Since a collector electrode oxidizes with a long-term use, its electrical resistance further rises from the initial electrical resistance, increasing the loss of a conversion efficiency.

(3) A collector electrode peels from a semiconductor or a transparent electrode under the influence of humidity to gradually degrade the function as a collector electrode.

(4) Some material, such as a polymer binder, optically degrades upon irradiation with light to produce fine cracks or cause breaking of a collector electrode, causing the collector electrode to lose its function.

In these respects, some improvements have been made to decrease the electrical resistance of a collector electrode or to stabilize the operation of a collector electrode over a long time period. One example is a method of binding conductive powders of gold and silver with low-melting glass, as disclosed in Japanese Patent Publication No. 61-59549.

Other examples are a method of binding gold, silver, and aluminum with low-melting glass, as disclosed in Japanese Patent Publication. No. 61-59551 (U.S. Pat. No. 4,256,513) and a method of binding a conductive powder consisting of a nickel-antimony alloy by using a binder, as disclosed in Japanese Patent Publication No. 62-8958 (U.S. Pat. No. 4,342,796).

Japanese Patent Publication Nos. 63-11791, 2-3553, 2-3554 (U.S. Pat. No. 4,486,232), or 2-3555 also discloses a method of adding various metals, such as bismuth and a rare earth element, to silver and binding the resultant material by using a binder.

In any of the above methods, however, the volume resistivity of a collector electrode is approximately 30 to 50 $\mu\Omega$·cm, i.e., is not sufficiently lowered as that of a collector electrode of a photovoltaic device, and this increases the loss of a conversion efficiency. In addition, no satisfactory solutions have been obtained yet in long-term stability, humidity resistance, and light resistance.

As shown in FIG. 9, a conventional collector electrode of a photovoltaic device is often fabricated by printing a conductive paste material obtained by monodispersing fine silver particles about 1 to 10 μm in diameter in a polyester-based, polyimide-based, epoxy-based, or phenol-based thermosetting resin or in a glass frit, and mixing the dispersant with an organic solvent, such as Cellosolve, for controlling the viscosity on a transparent electrode layer 71 as an electrode formation surface of a photovoltaic device by using a stencil screen or the like, and thermally hardening the resultant structure. This structure makes it possible to form an electrode at a high productivity and a high material yield by using a material with a very large area, largely contributing to a reduction in the manufacturing cost that is currently one major problem of photovoltaic devices.

In this case, as a collector electrode 74 made from the conductive paste, one having a line width d of 100 to 150 μm and a thickness h of 10 to 20 μm is common for the mass-production purpose.

Various substances can be used as the material of the conductive paste. In an amorphous silicon-based solar cell which is apt to be easily damaged by high-temperature treatments, however, it is common to use a polymer paste prepared by monodispersing fine copper or silver particles about 1 to 5 μm in diameter in a polyester-based, polyimide-based, epoxy-based, or phenol-based thermosetting resin.

Recently, however, with improving photoelectric conversion efficiencies or increasing areas of photovoltaic devices, a demand has arisen for a collector electrode with a smaller loss than those of the conventional collector electrodes, and so collector electrodes formed using only a conductive paste have become unable to meet these requirements. As an example, the collector electrode 74 formed from the conductive paste consisting of the thermosetting resin has a specific resistance of $3 \times 10^{-5}$ to $5 \times 10^{-5}$ Ω·cm. In addition, when fine printing with a smaller line width is performed in order to reduce a loss produced by blocking of light by the collector electrode, a printing variation increases or the film thickness decreases accordingly, and a generation loss derived from the resistance of the collector electrode largely increases. Furthermore, heating for a long time period is required to harden such a conductive paste, so it is practically difficult to obtain a thick electrode by coating layers of the paste one atop the next.

As shown in FIG. 10, therefore, a collector electrode according to the present invention has a structure in which a material 87 with a low specific resistance, such as solder, is placed on a conductive paste 84 as described above. This collector electrode causes lesser deterioration with time and has a low specific resistance.

In addition, it is desirable to increase the film thickness in order to improve the efficiency of a collecting function. If, however, a material with a high wettability with respect to solder is simply used as a conductive paste to increase bonding properties with respect to the solder, the curvature of the solder material decreases and no sufficient film thickness can be obtained.

Methods using vapor deposition or sputtering are also known as the electrode formation method. These methods, however, are almost never used in the manufacture of large-area devices because the manufacturing cost increases.

Note that losses produced by a collector electrode in a photovoltaic device are roughly classified into a loss caused by blocking of light by an electrode material and a resistance loss derived from a resistance that the electrode material has. To reduce the loss resulting from blocking of light, the line width of an electrode must be decreased.

When, however, the line width is decreased in order to reduce the loss caused by blocking of light, it becomes difficult to obtain a large thickness in screen printing, and the resistance increases compared to the decrease in the line width under the influence of printing variations.

For example, the collector electrode formed by the conductive paste consisting of a thermosetting resin mentioned earlier in the conventional example has a volume resistivity of $3 \times 10^{-5}$ to $5 \times 10^{-5}$ Ω·cm. In addition, when fine printing is performed to reduce the loss derived from blocking of light by the electrode, a printing variation increases or the film thickness decreases accordingly, resulting in a large increase in the resistance loss of the collector electrode. Furthermore, since a conductive paste of the above sort must be heated for a long period of time to be hardened, it is difficult to obtain a large thickness by coating layers of the paste one on top of another.

FIG. 29 shows the structure of a collector electrode in which a material with a low volume resistivity is placed on a bound conductive member consisting of the conductive paste described above.

FIGS. 28A to 28F illustrate a practical example of the steps of fabricating this structure. First, a conductive paste 20202 of the above sort is printed on a transparent electrode ($SnO_2$, $InO_3$, or ITO) 20201 of a photovoltaic device (FIG. 28A), and the resultant structure is thermally hardened in a thermodrying oven (FIG. 28B).

It was found, however, that when a solder layer 20203 was formed on the conductive paste 20202 by using molten solder, this solder layer 20203 was very thin and hence unsatisfactory to improve the resistance loss although the layer had an effect of increasing an environmental resistance. FIG. 27 is a graph showing the thickness of a collector electrode with solder formed when molten solder was dip-brazed onto a bound conductive member consisting of a polymer type conductive paste.

The present inventor, therefore, printed a solder paste, formed by mixing fine solder particles 30 to 50 μm in diameter with a cream flux, by using a metal plate, and thermally melting the resultant structure in a hot-air drying oven. As a result, a thick electrode with an average film thickness of 30 μm for a width of 300 μm was realized, indicating a considerable improvement compared to the electrode formed by the dip-brazing.

If, however, the amount of a solder paste to be placed is simply increased by increasing the film thickness of a metal plate in order to realize a larger thickness than that obtained by the above process, the solder on the bound conductive member sometimes reaches a saturated critical amount. In such a case, the solder concentrates on a particular portion of the bound conductive member, forming a giant solder ball.

SUMMARY OF THE INVENTION

It is an object of the present invention to provide a semiconductor device which includes a collector electrode having excellent characteristics described below, which has a high conversion efficiency, and which can stably operate over long periods of time. More specifically, the semiconductor devices of the present invention are as follows.

(1) A photovoltaic device in which the electrical resistance of a collector electrode is low enough to decrease a Joule loss, thereby decreasing the loss of a conversion efficiency.

(2) A photovoltaic device which maintains an initial conversion efficiency of the device at a high level and can therefore operate stably over a long-term use.

(3) A photovoltaic device in which no peeling of a collector electrode from a semiconductor or a transparent electrode occurs against various environmental factors, such as a high-humidity state, a high-temperature state, a low-temperature state, and repetition of these states, and which can therefore keep the initial function of the collector electrode at a high level.

(4) A photovoltaic device in which a collector electrode hardly causes optical degradation, such as fine cracks or breaking, upon irradiation with light, and which can therefore keep the initial function of the collector electrode at a high level.

(5) A photovoltaic device having an electrode structure which can decrease a loss caused by blocking of light while maintaining a low resistance loss and a high conversion efficiency, and can be fabricated at a low cost. A method and an apparatus for fabricating this photovoltaic device are also provided.

According to an aspect of the present invention, there is provided a photoelectric converting device comprising a semiconductor for performing photoelectric conversion, and a collector electrode formed on the semiconductor, wherein the collector electrode has a bound conductive member consisting of at least conductive particles and a polymer binder, and a metal member which covers the bound conductive member and is electrically connected to the bound conductive member.

In the above photoelectric converting device of the present invention, the metal member covers a portion on the bound conductive member except for a junction surface between the bound conductive member and the semiconductor.

In the above photoelectric converting device of the present invention, the conductive particles consist of two or more types of metal materials.

In the above photoelectric converting device of the present invention, at least one type of a metal material of the conductive particles consisting of two or more types of metal materials is localized on the surface or in the vicinity of the surface of each conductive particle.

In the above photoelectric converting device of the present invention, the metal member consists of a low-melding metal which is a metal, an alloy, or a mixture thereof, and a conductive powder contained in the low-melting metal and having a higher melting point than that of the low-melting metal.

In the above photoelectric converting device of the present invention, the conductive powder consists of at least one of tin, lead, palladium, zinc, silver, copper, a copper alloy, gold, and nickel.

In the above photoelectric converting device of the present invention, the conductive powder is present on the surface or in the vicinity of the surface of the low-melting metal.

In the above photoelectric converting device of the present invention, the melting point of the conductive powder is higher by 100° C. or more than that of the low-melting metal.

In the above photoelectric converting device of the present invention, the conductive powder is present on the surface or in the vicinity of the surface of the bound conductive member.

In the above photoelectric converting device of the present invention, the low-melting metal is a eutectic alloy.

In the above photoelectric converting device of the present invention, the conductive particles have wettability with respect to the eutectic alloy.

In the above photoelectric converting device of the present invention, the metal having wettability is a ferromagnetic metal.

In the above photoelectric converting device of the present invention, the amount of the metal material localized on the surface or in the vicinity of the surface of a conductive particle is reduced toward the interior of the conductive particle.

In the above photoelectric converting device of the present invention, the metal member is solder consisting primarily of Sn, Pb, or In.

In the above photoelectric converting device of the present invention, the metal member consists primarily of Cu.

In the above photoelectric converting device of the present invention, the conductive particles consist primarily of Cu, Sn, Pb, Ni, Ag, Pb, or Au, and the metal member is solder consisting primarily of Sn, Pb, or In.

In the above photoelectric converting device of the present invention further comprising a transparent conductive film between the semiconductor and the collector electrode.

In the above photoelectric converting device of the present invention, the semiconductor is amorphous silicon.

According to another aspect of the present invention, there is also provided a photoelectric converting device comprising a semiconductor for performing photoelectric conversion, and a collector electrode formed on the semiconductor, wherein the collector electrode has a low-melting metal which is a metal, an alloy, or a mixture thereof, and a conductive powder contained in the low-melting metal and having a melting point higher than that of the low-melting metal.

In the above photoelectric converting device of the present invention, the low-melting metal is a eutectic alloy.

In the above photoelectric converting device of the present invention, the conductive powder has wettability with respect to the eutectic alloy.

In the above photoelectric converting device of the present invention, the conductive powder consists of silver, copper, gold, palladium, or tin.

In the above photoelectric converting device of the present invention, the metal having wettability is a ferromagnetic metal.

In the above photoelectric converting device of the present invention, the ferromagnetic metal consists of at least one of nickel and iron.

In the above photoelectric converting device of the present invention, the conductive powder consists of a high conductive metal and a ferromagnetic metal.

In the above photoelectric converting device of the present invention, the conductive powder is present on the surface or in the vicinity of the surface of the low-melting metal.

In the above photoelectric converting device of the present invention, the melting point of the conductive powder is higher by 100° C. or more than that of the low-melting metal.

In the above photoelectric converting device of the present invention, the conductive powder is present on the surface or in the vicinity of the surface of the bound conductive member.

In the above photoelectric converting device of the present invention further comprising a transparent conductive film between the semiconductor and the collector electrode.

In the above photoelectric converting device of the present invention, the semiconductor is amorphous silicon.

According to still another aspect of the present invention, there is also provided a method of manufacturing a photoelectric converting device, in which a collector electrode is formed on a semiconductor for performing photoelectric conversion, comprising the steps of forming a conductive paste consisting of conductive particles and a polymer binder into a desired shape, hardening the conductive paste to form a bound conductive member, and forming a metal member which covers the bound conductive member and is electrically connected to the bound conductive member.

According to still another aspect of the present invention, there is also provided a method of manufacturing a photoelectric converting device, in which a collector electrode is formed on a semiconductor for performing photoelectric conversion, comprising the steps of forming a conductive powder and a powder of a low-melting metal, which is a metal, an alloy, or a mixture thereof and has a lower melting point than that of the conductive powder, into a desired shape on the semiconductor, and melting partially or entirely the low-melting metal powder to form a collector electrode.

The conventional problems mentioned earlier can be solved by the above means of the present invention.

DESCRIPTION OF THE PREFERRED EMBODIMENTS

Figure 1:
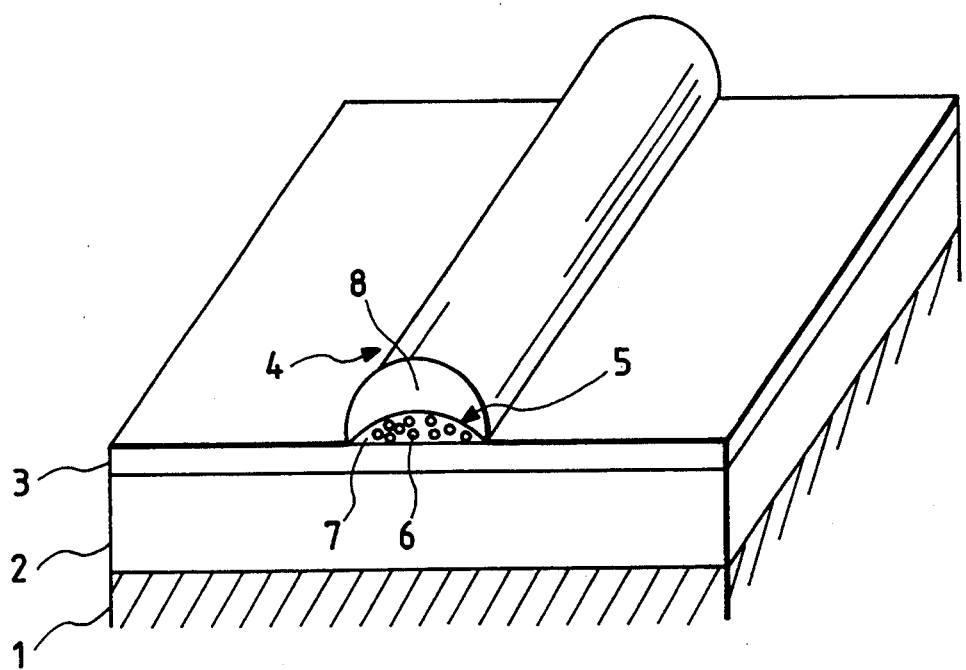
FIG. 1 is a schematic perspective view showing a photovoltaic device according to Example 1 of the present invention.

The first effect of the present invention is the ability to significantly decrease the electrical resistance of a collector electrode.

A bound conductive member formed by, e.g., calcining a pasty substance (which will be sometimes referred to as a conductive paste hereinafter) consisting of a conductive powder and glass or a polymer (binder) has a volume resistivity of 30 to 50 $\mu\Omega$·cm or more.

When a collector electrode with a line width of 200 $\mu$m and an average film thickness of 10 $\mu$m is formed by using only the conductive paste of this type, a linear resistance becomes 1.5 $\Omega$/cm or more, resulting in a collector electrode with a high electrical resistance. Consequently, the collecting loss extremely increases to decrease the conversion efficiency significantly.

As in the collector electrode according to the present invention, on the other hand, the electrical resistance of a collector electrode can be largely reduced by forming a bound conductive member (a member formed by hardening the conductive paste will be sometimes referred to as a bound conductive member hereinafter) containing a conductive powder together with a metal member (which will be sometimes referred to as a metal layer hereinafter) covering this bound conductive member. As an example, when a bound conductive member is formed by using the conductive paste of the above sort and a 2-$\mu$m thick, 200-$\mu$m wide copper member is formed on top of the bound conductive member, the bound conductive member consisting of the conductive paste and the metal member (copper) are electrically connected in parallel with each other. The total linear resistance of this structure of the present invention becomes 0.21 $\Omega$/cm, although the linear resistance of copper alone is 0.25 $\Omega$/cm, because the parallel connection is formed between the bound conductive member and the metal member (copper). This greatly decreases the electrical resistance of a collector electrode to 1/7.

Likewise, when a 10-$\mu$m thick, 200-$\mu$m wide solder member (metal member) is formed on top of a bound conductive member consisting of the above conductive paste, the total linear resistance becomes 0.4 $\Omega$/cm, although the linear resistance of solder (metal member) alone is 0.5 $\Omega$/cm, because the bound conductive member and the metal member are connected in parallel with each other. As a result, the electrical resistance of a collector electrode is largely reduced to $\frac{1}{4}$.

As can be seen in these examples, the present invention significantly decreases the resistance of a collector electrode, realizing a photovoltaic device with a high conversion efficiency.

Note that the above effect is not limited to bound conductive members with a volume resistivity of 30 to 50 $\mu\Omega$·cm or more but can be similarly obtained in bound conductive members with lower volume resistivities.

The second and most significant effect of the present invention is the ability to protect a bound conductive member containing a conductive powder by using extremely superior moisture barrier properties and light-shielding properties of a metal member, obtained by forming the metal member on the side of the bound conductive member containing the conductive powder away from a semiconductor (in this case, it is preferable to form the metal member over substantially the whole length). In particular, a surprising protecting effect can be achieved by covering the entire surface of the bound conductive member containing the conductive powder away from the semiconductor with the metal.

If the bound conductive member containing the conductive powder is exposed or if covering is insufficient even when the bound conductive member is covered with a polymer, the bound conductive member is largely adversely affected by humidity because the conductive powder that easily causes ion migration is contained.

As a result, a dendrite grows through defective portions of a semiconductor owing to the ion migration, resulting in an unstable operation caused by a short circuit of the semiconductor or the like. In addition, oxidation is extremely accelerated because, for example, the surface area of the conductive powder is large, and so a rise in electrical resistance is observed frequently.

Alternatively, moisture absorption by the binder leads to peeling of the bonding surface, and this raises the contact resistance to result in a large degradation in the collecting function.

Since forming the metal member can prevent moisture from entering the bound conductive member, all the deteriorations associated with moisture described above can be reduced significantly.

The bound conductive member containing the conductive powder is largely influenced by light upon irradiation with light.

The binder contained in the bound conductive member having the conductive powder optically decomposes to become brittle upon irradiation with light, producing fine cracks (crazes) or disconnections or causing peeling of the bonding surface. Consequently, a rise in electrical resistance is often observed, indicating a large degradation in the collecting function.

Since light can be blocked by forming the metal member, an effect of significantly decreasing all deteriorations caused by light can be expected as well as the effect of preventing the optical decomposition described above.

In addition, when a transparent conductive film or the like is formed on a semiconductor layer, a collector electrode with an arrangement in which a metal member is formed on a bound conductive member consisting of a conductive powder can improve adhesion properties as compared with a collector electrode with an arrangement in which a metal member is formed directly on the transparent conductive film.

According to the present invention, by taking into account the above-mentioned effects, a collector electrode which collects power generated by a semiconductor layer having a photovoltaic power, and in which a metal member is formed on a bound conductive member, is formed on the semiconductor layer. The photovoltaic device having this structure of the present invention can achieve an extremely superior performance, such as a high conversion efficiency and the ability to keep the initial stable operation over long periods of time.

Conductive particles

Preferable examples of conductive particles are particles of metals, such as copper, nickel, tin, lead, zinc, aluminum, iron, chromium, and titanium in addition to gold, silver, platinum, and palladium; particles of alloys of these metals and other metals: particles of doped metals; particles of these metals or other metals, which are imparted with a special distribution; surface-coated particles of these metals or other metals; and particles of oxides, such as ITO, ZnO, and SnO. The conductive particles may also be mixtures of these particles.

The characteristic feature of the present invention is that even structures mainly consisting of metals, such as copper, nickel, tin, zinc, aluminum, and iron, which have been conventionally considered difficult to apply because of a problem of oxidation and the like, very hardly oxidize and therefore can be used stably.

In addition, according to the present invention, even structures mainly consisting of metals, such as indium, palladium, chromium, titanium, tin, lead, iron, cobalt, and nickel, or of fine particles of metal oxides, such as ITO, ZnO, and SnO, which have been conventionally considered difficult to apply because of their high electrical resistances, can be used with electrical resistances lowered.

Especially when conductive particles consisting of a plurality of metals are used, in covering the conductive particles with a metal to be stacked on them, the covering ratio of the metal can be increased, defects such as pinholes of the metal member are small in number, and the adhesive power of the metal member increases, demonstrating more surprising effects of the present invention.

Examples of the structures of conductive particles that can provide the above effects are as follows.

(1) A so-called graded alloy particle which consists of a plurality of metals and in which the distribution of one of the metals gradually decreases from the surface to the interior of the particle. Examples are a copper alloy in which the distribution of silver has a gradient, a copper alloy in which the distribution of tin has a gradient, a copper alloy in which the distribution of lead has a gradient, a silver alloy in which the distribution of copper has a gradient, a silver alloy in which the distribution of tin has a gradient, a silver alloy in which the distribution of palladium has a gradient, and an aluminum alloy in which the distribution of copper has a gradient. The same surprising effects can be obtained by a tertiary metal system and a quaternary metal system as well as a binary metal system.

Examples of the method of forming these particles are a method of obtaining a gradient by controlling metal supply quantities from a plurality of metal sources through vacuum heating or sputtering; a method of obtaining a gradient by making use of the difference between ion precipitation tendencies in a process of reduction precipitation in a solution; and a method of obtaining a gradient by using the difference in melting point when a molten alloy is atomized. The graded distribution can also be controlled by further performing a heat treatment for these particles.

(2) A particle which consists of a certain kind of a metal and is surface-coated with a different metal. Examples are a copper particle surface-coated with silver, a copper particle surface-coated with tin, a copper particle surface-coated with lead, a silver particle surface-coated with copper, a silver particle surface-coated with tin, a silver particle surface-coated with palladium, an aluminum particle surface-coated with copper, and an iron particle which is carbon-coated.

Particles of this type can be formed by a method of implanting metal ions into various metal particles, a method of performing wet plating, or a method of treating a plurality of kinds of metal particles under forced stirring.

(3) A so-called alloy particle which consists of a plurality of metals and in which the distribution is relatively even. Examples are a brass particle, a bronze particle, a gold-copper alloy particle, a phosphor bronze particle, a purified silver particle, and a tin-lead alloy particle.

(4) A particle formed by mixing different metal particles. Examples are a copper-silver mixture particle, a copper-tin mixture particle, and a palladium-silver mixture particle.

Although various particle sizes are usable as the particle size of the conductive particles, the number-average particle size is preferably 0.01 to 100 μm in respect of electrical resistance or long-term operating stability (the number-average particle size is an average value of the diameters of particles measured by a sedimentation method or an average value of the diameters of true circles equivalent to the sectional areas of individual particles).

As the binder for binding the conductive particles, both inorganic and organic materials generally known as binders can be applied.

For example, various glass materials are usable as the inorganic binder, and a thermoplastic polymer and a curable polymer are usable as the organic binder.

Usable examples of the thermoplastic polymer binder are a saturated polyester resin, a phenolic resin, an acrylic resin, a styrene resin, an epoxy resin, an urethane resin, a vinyl acetate resin, a vinyl chloride resin, a vinyl alcohol resin, an acetal resin, an amide resin, and modified resins and copolymer resins of these resins.

Usable examples of the curable polymer binder are an imide resin, an unsaturated polyester resin, a phenolic resin, an alkyd resin, an unsaturated acrylic resin, an epoxy resin, a polyurethane resin, a melamine resin, a diallylphthalate resin, and oligomers and modified resins of these resins.

In particular, the curable polymer binders can provide a superior effect in terms of long-term operating stability.

Especially when a number-average molecular weight was 5,000 or less, the adhesive power of a metal to be stacked was further enhanced to achieve more surprising effects.

In some cases, the effects of the present invention can be further improved by adding a small amount of a thermoplastic polymer to a curable polymer or by adding various additives, such as coupling agents and dispersants, for the purpose of controlling the dispersibility of the conductive particles or the wettability with respect to the binder.

The mixing ratio of the conductive particles to the binder is represented by:

$$\frac{\text{(weight of conductive particles)}}{\text{(weight of conductive particles)} + \text{(weight of binder)}} \times 100$$

The mixing ratio is preferably 3% to 50% when electrical resistance and operating stability over a long period of time are taken into account.

As mixing means, stirring or milling is used while adding a proper amount of a diluting solvent as needed.

As a milling apparatus, it is possible to use various milling apparatuses commonly used, such as a roll mill, a bead mill, a sand mill, an ultrasonic mill, an injection collision mill, and a ball mill.

The bound conductive member having the conductive particles can be formed by printing means, such as screen printing, planographic printing, intaglio printing, or relief printing, when the member is in the form of an ink. The bound conductive member can also be formed on a semiconductor layer by supplying using supplying means, such as a dispenser, and by hardening by heat drying or thermal hardening, or by using light or electron beams. The film thickness of the bound conductive member preferably ranges between 0.1 and 500 μm in respect of electrical resistance and long-term operating stability.

The effects of the present invention were not reduced at all even when a transparent conductive film, an anti-reflection film, a protective film, and the like were formed between the semiconductor layer and the bound conductive member having the conductive particles.

Metal member

The metal for covering the surface of the bound conductive member having the conductive particles away from the semiconductor layer over substantially the whole length of the surface preferably has a volume resistivity of 50 μΩ·cm or less when electrical resistance is taken into account. This metal is formed to have a projected shape, a recessed shape, a circular shape, an elliptic shape, a rectangular shape, or the like. Examples of the metal are gold, silver, platinum, palladium, copper, nickel, tin, lead, zinc, aluminum, indium, iron, chromium, titanium, metals mainly consisting of these metals, and alloys of these metals.

A metal with a volume resistivity of 30 $\mu\Omega\cdot$cm or less is most preferred. Examples are gold, silver, platinum, palladium, copper, nickel, tin, lead, zinc, aluminum, indium, iron, chromium, metals mainly consisting of these metals, and alloys of these metals.

Examples of a metal which is very excellent in particularly adhesion properties and operating stability are various low-melting solders mainly consisting of tin and lead, a low-melting alloy containing indium, a metal with a relatively high stretchability, such as copper, tin, lead, zinc, aluminum, indium, gold, silver, and palladium, and alloys containing these metals.

Examples of means of forming the metal member are means using vacuum vapor deposition or sputtering, wet forming means using plating, means of dip-coating in a molten metal, and powdery metal melting means. It is also possible to use other general metal member forming means.

The film thickness is preferably 0.01 to 500 $\mu$m in terms of electrical resistance and operating stability over a long time period.

The conductive powder of the present invention has an effect of adsorbing a low-melting metal, such as a solder material, an alloy, or a mixture (to be referred to as a low-melting metal hereinafter). In the formation of an electrode layer consisting of a low-melting metal, the conductive powder suppresses the flowability of a molten metal to fix a larger amount of the low-melting metal on a semiconductor layer (or a transparent conductive layer). This makes formation of a low-melting metal layer with a larger thickness possible.

The resistance of the collector electrode can be further decreased by forming aggregates of the conductive powder relatively close to one another in the vicinity of the surface of the low-melting metal.

This can consequently decrease the resistance of the electrode and thereby increase the efficiency of the photovoltaic device. In addition, by decreasing the line width in accordance with the decrease in resistance achieved by the large thickness, the loss caused by blocking of light by the collector electrode can be reduced to further increase the generation efficiency of the photovoltaic device.

The arrangements of the photovoltaic devices according to the present invention will be described in detail below with reference to FIGS. 3 and 4.

Figure 3:
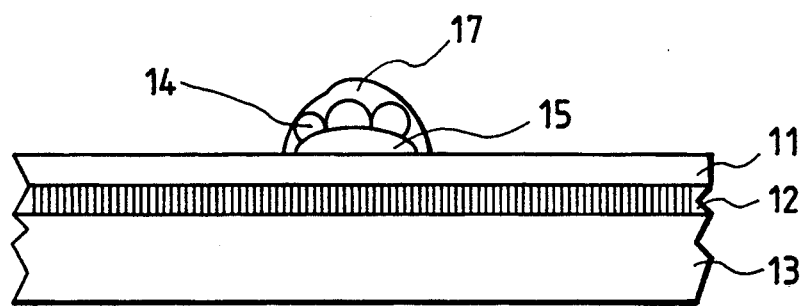
FIG. 3 is a schematic sectional view showing a photovoltaic device of the present invention.

Referring to FIG. 3, this photovoltaic device comprises a transparent conductive film 11, a semiconductor layer 12, a substrate 13, a conductive member 15 for fixing a conductive powder 14, and a low-melting metal layer 17.

Figure 4:
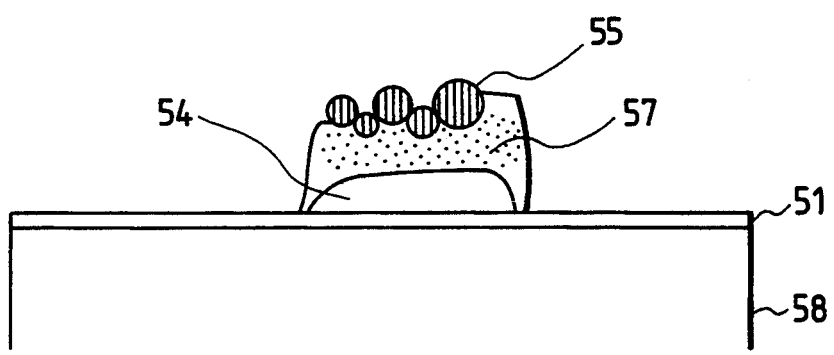
FIG. 4 is a schematic sectional view showing a photovoltaic device of the present invention.

Referring to FIG. 4, this photovoltaic device comprises a transparent conductive film 51, a semiconductor layer 58, a bound conductive member 54, a conductive powder 55, and a low-melting metal layer 57.

Low-melting metal

Any metal or alloy can be used as the low-melting metal of the present invention as long as the melting point of the metal or alloy is lower than that of the conductive powder over a temperature range within which a semiconductor is not damaged. However, the low-melting metal preferably has a melting point different by 100° C. or more from that of the conductive powder because an electrode layer with a larger thickness can then be formed. A practical example of the low-melting metal is solder, and examples of the solder material are Sn-Pb-based solder, Sn-Ag-based solder, Pb-group solder, and In-group solder. It is also possible to use cream solder, and the use of the cream solder is more preferable because the thickness of the solder can be controlled.

Conductive powder

As the conductive powder 14 fixed to the semiconductor layer side in the present invention, a powder consisting of palladium, gold, silver, copper, a copper alloy, nickel, or zinc, or a powder containing these metals can be preferably used. The use of these metals suppresses the flowability of solder because of the adsorption function that the conductive powder has in heat melting, increasing the solder amount per unit area, and further decreasing the electrical resistance of a collector electrode.

As the conductive powder 55 formed on and/or in the vicinity of the surface of the low-melting metal layer, a powder consisting of palladium, gold, silver, copper, a copper alloy, zinc, or nickel, or a powder containing these metals can be preferably used. These metals are superior to other metals in specific resistance and properties of binding with the solder materials and can therefore further lower the resistance of a collector electrode.

The conductive powder particles of the present invention are not limited to spherical particles but may be scaly particles or needle-like particles. Although the size of the particles depends on the width of a collector electrode to be formed, it is preferably about 0.1 to 100 $\mu$m.

Any material can be used as the material of the conductive members 15 and 54 of the present invention provided that the material has a high bonding power (high wettability) with respect to the semiconductor layer (or the transparent conductive film) and the low-melting metal. For example, it is preferable to use a bound conductive member formed by dispersing particles of a metal, such as gold, silver, copper, nickel, or iron, into a binder consisting of an organic resin, such as an epoxy resin, a phenolic resin, a polyester resin, or a polyimide resin. In situations where a treatment at a relatively high temperature is possible, a calcined paste formed by mixing the above metal material with a glass frit is also usable.

By co-dispersing fine particles of at least one type of a metal with a solder wettability or fine particles of two or more different types of metals with a solder wettability into solder of a eutectic alloy as the low-melting metal on the bound conductive member, it is possible to suppress the flowability of the solder in heat melting to thereby increase the saturated critical amount of the solder on the bound conductive member to twice or more those of comparative examples. In this case, any metal particles can be dispersed in the low-melting metal as long as the particles have wettability with respect to solder. Examples of the metal are silver, tin, gold, copper, brass, bronze, lead, nickel, a monel metal, zinc, iron, stainless steel, nichrome, aluminum, and palladium. In addition, the solder as the low-melting metal is not limited to a so-called Sn-Pb-based solder but may be any of Sn-group solder, Pb-group solder, and In-group solder.

The present invention will be described in more detail below by way of its examples.

EXAMPLE 1

Cr was deposited to have a thickness of 2,000 Å on a 1-mm thick stainless steel substrate (SUS430) 1 by a DC sputtering process, and the following steps were performed by an RF plasma CVD process.

In step 1, a 500-Å thick n-type semiconductor was formed by supplying a gas mixture of $SiH_4/PH_3$ (99.98/0.02) at 1 Torr and an RF power of 100 W. Subsequently, in step 2, a 5,000-Å thick i-type semiconductor was formed by supplying a gas mixture of $SiH_4/H_2$ (30/70) at 1.5 Torr and an RF power of 50 W.

In step 3, a 200-Å thick p-type semiconductor was formed by supplying a gas mixture of $SiH_4/H_2/BF_3$ (3/96.7/0.3) at 1.2 Torr and an RF power of 1 kW.

The above process was repeated twice to form a semiconductor layer 2 having an nipnip junction, a so-called tandem cell.

In was vapor-deposited on the surface of the resultant structure by introducing $O_2$ gas at 0.5 Torr, forming a 700-Å thick transparent conductive film 3.

Subsequently, a conductive paste 7 consisting of 75 parts by weight of graded alloy particles 6 with an average particle size of 10 μm, in which the total silver content was 5 wt %, the silver content on the surface of each particle was 75 wt %, and the content of silver gradually decreased toward the interior of each particle, 20 parts by weight of an epoxy resin with an average molecular weight of 500, and 5 parts by weight of ethoxyethanol, was screen-printed and thermally hardened at 180° C. for 60 minutes, forming a dispersion-system bound conductive layer 5 with a width of 200 μm and an average film thickness of 20 μm. The volume resistivity of the bound conductive layer 5 was 50 μΩ·cm.

In addition, a tin-lead (alloy ratio: tin 60%, volume resistivity 17 μΩ·cm) cream solder (average particle size 30 μm, flux content 15%) was stacked by screen printing to have a width of 500 μm over the whole length of the dispersion-system bound conductive layer 5 and heat-melted at 230° C. for five minutes to form a metal layer 8 with an average film thickness of 30 μm, thereby completing a collector electrode 4 (see FIG. 1).

EXAMPLE 2

The same process as in Example 1 was performed except that copper particles with an average particle size of 10 μm were used in place of the graded alloy particles. The volume resistivity of the resultant dispersion-system bound conductive layer was 70 μΩ·cm.

Comparative Examples 1 & 2

Comparative Examples 1 and 2 were made following the same procedures as in Examples 1 and 2 except that no metal layers were formed.

The initial characteristics and the characteristics deteriorated under the following conditions of Examples 1 and 2 and Comparative Examples 1 and 2 are summarized below.

| | Initial characteristics | | | |
|---|---|---|---|---|
| | Example 1 | Example 2 | Comparative Example 1 | Comparative Example 2 |
| Electrical resistance of collector electrode | 0.22Ω/cm | 0.24Ω/cm | 1.25Ω/cm | 1.75Ω/cm |
| Series resistance | 35Ω·cm² | 38Ω·cm² | 200Ω·cm² | 270Ω·cm² |
| Shunt resistance | 50kΩ·cm² | 50kΩ·cm² | 50kΩ·cm² | 50kΩ·cm² |
| Conversion efficiency | 8.0% | 7.9% | 6% | 5.5% |

Characteristics after irradiation at 65° C. 90%RH (relative humidity), AM 1.5, and irradiation intensity of 1 kw/cm² for 550 hours

| | Example 1 | Example 2 | Comparative Example 1 | Comparative Example 2 |
|---|---|---|---|---|
| Electrical resistance of collector electrode | 0.23Ω/cm | 0.26Ω/cm | 2.50Ω/cm | 4.37Ω/cm |
| Series resistance | 50Ω·cm² | 55Ω·cm² | 390Ω·cm² | 700Ω·cm² |
| Shunt resistance | 45kΩ·cm² | 45kΩ·cm² | 10kΩ·cm² | 3kΩ·cm² |
| Conversion efficiency | 7.2% | 7.1% | 4% | 2.5% |

The above results demonstrate that Examples 1 and 2 of the present invention had very high performance.

EXAMPLE 3

A conductive paste consisting of 90 parts by weight of an Ag-plated nickel powder obtained by surface-coating nickel particles 5 μm in average particle size with 0.5-μm thick Ag through Ag chemical plating (using a generally known Ag chemical plating solution), 7 parts by weight of a thermosetting acrylic resin with a number-average molecular weight of 800, and 3 parts by weight of ethoxyethanol was screen-printed on the semiconductor layer 2 used in Example 1 and thermally hardened at 200° C. for 60 minutes, thereby forming a dispersion-system bound conductive layer 5, which was 200 μm in width and 25 μm in average film thickness. The volume resistivity of the bound conductive layer 5 was 100 μΩ·cm.

In addition, a tin-lead-silver (alloy ratio: tin 30, lead 65, and silver 5, volume resistivity 113 μΩ·cm) cream solder (average particle size 30 μm, flux content 10%) was stacked by screen printing to have a width of 500 μm over the whole length of the dispersion-system bound conductive layer 5 and heat-melted at 230° C. to form a metal layer 9 with an average film thickness of 30 μm, thereby completing a collector electrode 4.

EXAMPLE 4

Figure 2:
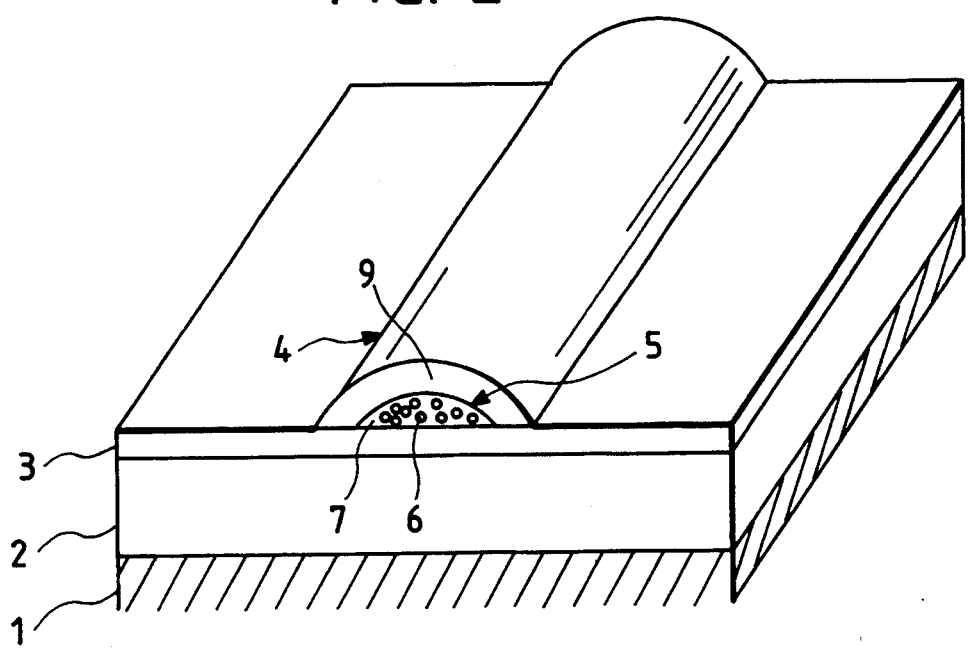
FIG. 2 is a schematic perspective view showing a photovoltaic device according to Example 4 of the present invention;.

A dispersion-system bound conductive layer 5 was formed following the same procedures as in Example 3, and copper electroplating (with an applied voltage of 1.3 V for 30 minutes in a common sulfuric acid plating bath) was performed on the layer 5, thereby depositing a 260-μm wide, 30-μm thick metal layer 9 with a copper volume resistivity of 1.7 μΩ·cm over the whole length of the dispersion-system bound conductive layer 5. (See FIG. 2 in which the same reference numerals as in FIG. 1 denote the same parts.)

Comparative Example 3

Comparative Example 3 was made following the same procedures as in Example 3 except that no metal layer 9 was formed.

The results were as follows.

| | Initial characteristics | | |
|---|---|---|---|
| | Example 3 | Example 4 | Comparative Example 3 |
| Electrical resistance of collector electrode | 0.19Ω/cm | 0.02Ω/cm | 2Ω/cm |
| Series resistance | 35Ω·cm² | 20Ω·cm² | 300Ω·cm² |
| Shunt resistance | 50kΩ·cm² | 50kΩ·cm² | 50kΩ·cm² |
| Conversion efficiency | 8.0% | 8.5% | 5.3% |

Characteristics after irradiation at 65° C., 90%RH (relative humidity), AM 1.5, and irradiation intensity of 1 kw/cm² for 550 hours

| | Example 3 | Example 4 | Comparative Example 3 |
|---|---|---|---|
| Electrical resistance of collector electrode | 0.20Ω/cm | 0.02Ω/cm | 3.8Ω/cm |
| Series resistance | 50Ω·cm² | 40Ω·cm² | 500Ω·cm² |
| Shunt resistance | 45kΩ·cm² | 45kΩ·cm² | 10kΩ·cm² |
| Conversion efficiency | 7.2% | 7.7% | 3.3% |

The above results indicate that Examples 3 and 4 of the present invention had very high performance.

EXAMPLE 5 & 6

A p-n junction was formed by performing vapor-phase diffusion of POCl₃ into a 0.2-mm thick p-type Si wafer, and aluminum was vapor-deposited on the entire surface of the p-type layer side. A collector electrode was formed on the n-type layer side, and an antireflection layer was also formed.

In Example 5, the collector electrode was formed following the same procedures as in Example 1. In Example 6, the collector electrode was formed following the same procedures as in Example 2.

Comparative Examples 4 & 5

Likewise, Comparative Examples 4 and 5 were made following the same procedures as in Comparative Examples 1 and 2.

The results were as follows.

| | Initial characteristics | | | |
|---|---|---|---|---|
| | Example 5 | Example 6 | Comparative Example 4 | Comparative Example 5 |
| Electrical resistance of collector electrode | 0.22Ω/cm | 0.24Ω/cm | 1.25Ω/cm | 1.75Ω/cm |
| Series resistance | 15Ω·cm² | 15Ω·cm² | 85Ω·cm² | 120Ω·cm² |
| Shunt resistance | 10kΩ·cm² | 10kΩ·cm² | 10kΩ·cm² | 10kΩ·cm² |
| Conversion efficiency | 14% | 13.9% | 10% | 9.0% |

Characteristics after irradiation at 65° C., 90%RH (relative humidity), AM 1.5, and irradiation intensity of 1 kw/cm² for 550 hours

| | Example 5 | Example 6 | Comparative Example 4 | Comparative Example 5 |
|---|---|---|---|---|
| Electrical resistance of collector electrode | 0.23Ω/cm | 0.26Ω/cm | 2.50Ω/cm | 4.4Ω/cm |
| Series resistance | 15Ω·cm² | 15Ω·cm² | 160Ω·cm² | 300Ω·cm² |
| Shunt resistance | 10kΩ·cm² | 10kΩ·cm² | 2kΩ·cm² | 1.5kΩ·cm² |
| Conversion efficiency | 14% | 13.9% | 8% | 6% |

The above results demonstrate that Examples 5 and 6 of the present invention had very high performance.

EXAMPLE 7

A method of manufacturing a photovoltaic device with the arrangement shown in FIG. 3 will be described below with reference to FIGS. 5A to 5G.

Figure 5A:
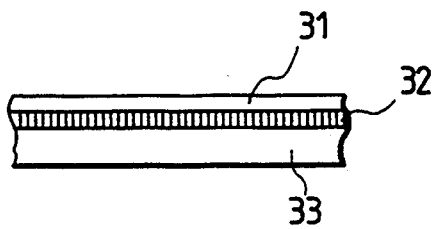
FIGS. 5A to 5G are schematic sectional views for explaining a process of manufacturing photovoltaic devices according to Examples 7 and 21 of the present invention.

FIG. 5A shows an amorphous-based photovoltaic device serving as an electrode formation surface, in which an amorphous silicon-based semiconductor 32 and a transparent conductive film 31 are formed on a stainless steel substrate 33. The transparent conductive film in this example is ITO which is 640 to 700 Å thick.

Since the specific resistance of ITO is high, approximately $1 \times 10^{-3}$ Ω·cm, as compared with those of metals, a collector electrode is formed on it by using a polymer paste material consisting of silver with a relatively low specific resistance. The silver polymer paste used in this example was prepared by mixing scaly silver particles with a particle size of 3 to 5 μm and spherical silver particles with a particle size of 1 to 2 μm into an epoxy resin by using a roll mill apparatus. These particle sizes were obtained by a sedimentation method.

Examples of the particle formation method are a method (electrolytic method) of precipitating particles at a cathode by electrolysis, a method (pulverizing method) of pulverizing a metal by using a pulverizer or a grinder, such as a ball mill or a crusher, and a method (atomizing method) of ejecting a molten metal through a narrow nozzle and blowing a compressed gas or a water jet against the molten metal, thereby blowing away the molten metal in the form of a mist and at the same time cooling the sprayed molten metal. The scaly and spherical silver particles in this example were formed by the atomizing method.

Figure 5B:
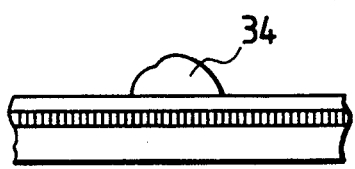

As shown in FIG. 5B (polymer paste printing), a pattern of a silver polymer paste 34 was screen-printed on a transparent conductive layer 31 by using a printing plate consisting of a 400-mesh stainless steel gauze and having an emulsion thickness of 30 μm. Under these conditions, a pattern with a line width of 100 μm and a thickness of about 30 μm was formed. Note that the silver polymer paste had no conductivity and had viscosity at this point. Note also that the thickness became about 20 μm after thermal hardening.

Figure 5C:
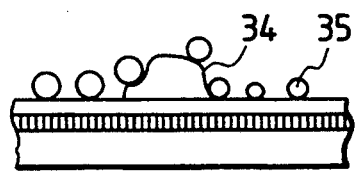

Subsequently, topping was performed by spraying Ni particles 35 with a particle size of 30 to 70 μm formed by the atomizing method onto the polymer paste by a powder spray process using compressed air. Prior to this topping, the surface of ITO was dried sufficiently. FIG. 5C (spraying of metal particles) illustrates this state. The Ni particles 35 thus sprayed adhere not only to the polymer paste 34 but to the transparent conductive film 31. Although the Ni particles were sprayed onto the paste by the powder spray process using compressed air in this example, they can also be coated by, e.g., a microdispenser.

Figure 5D:

An air flow or the like was blown to blow away the Ni particles except for those on the polymer paste. Thereafter, the resultant structure was dried at 160° C. by using an infrared thermodrying oven, hardening the polymer paste. The polymer paste shrunk and hardened upon heating while containing the Ni particles. FIG. 5D (removal of excess particles) illustrates this state. Referring to FIG. 5D, the Ni particles with relatively large particle sizes hardened on the surface of the paste while being contained in the fine silver particles. These Ni particles serve as a base for forming a solder layer.

Figure 5E:
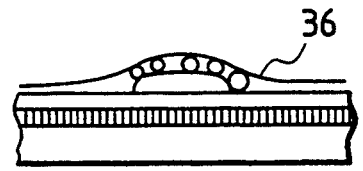

Subsequently, a flux 36 was coated on the overall electrode formation surface by the spray process (FIG. 5E). In addition to the spray process, coating using a brush, dipping into a flux solution, a jet process, or a dropping process can be used as the flux coating process.

Thereafter, a solder layer was formed on the flux-coated electrode formation surface by using a jet solder tank. In this case, an Sn60%Pb38%Ag2% molten solder flow flowing in one direction was formed and brought into contact with the electrode formation surface. The photovoltaic device itself was heated before and after contacting with this solder flow so that the solder did not harden to adhere to portions except for the electrode. A time for which the device was passed through the solder flow was set to about two to thirty seconds. Coating the flux can improve the wettability of the polymer paste and the metal particles with respect to the solder and can further prevent the adhesion of the solder to the electrode formation surface where no polymer paste is present.

Figure 5F:
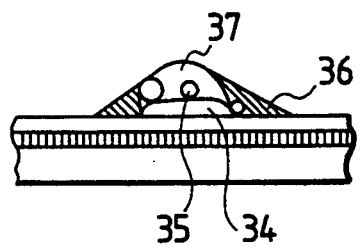
Figure 5G:
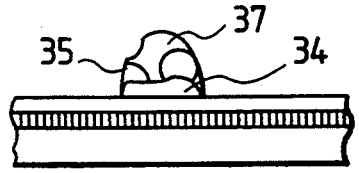

FIG. 5F shows the electrode formation surface after the formation of the solder layer, in which state a solder layer 37 was formed on the polymer paste 34 and a large-amount of the flux 36 remained on the electrode formation surface. The residual flux was washed away by shower washing using hot water. After the washing, the resultant structure was dried to complete the formation of the collector electrode (FIG. 5G).

It is preferable to perform the washing because the flux also contains the residual metal particles which are not removed by the air flow and, if the flux is either acidic or alkaline, it may corrode the transparent conductive film or block incident light when left behind.

It was confirmed that a low-resistance collector electrode having a central height of 50 μm and an average thickness of 40 μm regardless of its small line width of 100 μm could be manufactured with a high precision through the above procedures.

EXAMPLE 8

In this example, a collector electrode was manufactured following the same procedures as in Example 7 except that silver particles (purity 99.9%) with a particle size of 30 to 100 μm were used as the conductive powder.

As in Example 7, it was also confirmed in this example that a low-resistance collector electrode having an average thickness of 40 μm regardless of its small line width of 100 μm could be manufactured with a high precision.

EXAMPLE 9

In this example, a collector electrode was manufactured following the same procedures as in Example 7 except that copper particles with a particle size of 30 to 60 μm were used as the conductive powder.

As in Example 7, it was also confirmed in this example that a low-resistance collector electrode having an average thickness of 40 μm regardless of its small line width of 100 μm could be manufactured with a high precision.

EXAMPLE 10

A method of manufacturing a photovoltaic device with the arrangement shown in FIG. 3 will be described below with reference to FIGS. 6A to 6G.

Figure 6A:
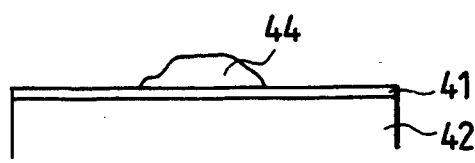
FIGS. 6A to 6G are schematic sectional views for explaining a process of manufacturing photovoltaic devices according to Examples 10 and 22 of the present invention.

FIGS. 6A to 6G show electrode formation steps using a cream solder paste. Referring to FIG. 6A (formation of conductive paste), a pattern 44 was formed by using a copper paste prepared by monodispersing copper particles 10 to 20 μm in particle size in a phenolic resin. FIG. 6A also illustrates a transparent conductive film ITO 41 and an amorphous silicon-based semiconductor layer 42 serving as a photovoltaic layer. In this structure, an electrode formation surface is the surface of the ITO film 41.

First, a copper paste line with a line width of about 100 μm was formed on the surface washed and dried well by using a screen printing machine.

Figure 6E:
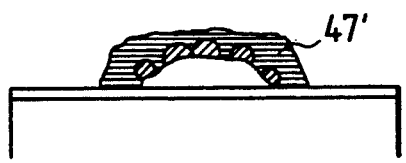
Figure 6B:
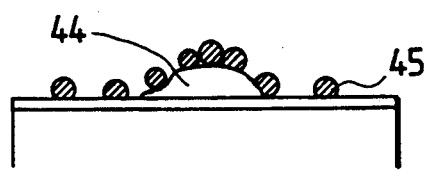

Subsequently, as shown in FIG. 6B (after spraying of conductive powder particles), zinc particles 45 with a particle size of 30 to 70 μm were sprayed onto the electrode formation surface. In this case, the zinc particles were sprayed while being scattered on the whole electrode formation surface.

Figure 6F:
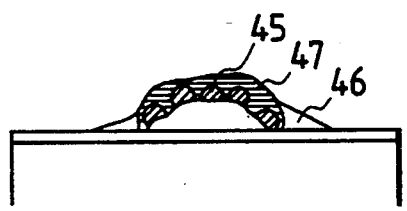
Figure 6C:
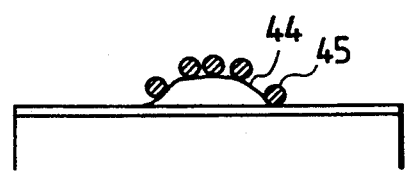

An air flow was flowed horizontally with respect to the electrode formation surface on which the zinc particles were scattered, removing the zinc particles except for those on the polymer paste so that the zinc particles were left behind only on the polymer paste. FIG. 6C (after air cleaning) shows this state.

Subsequently, the resultant structure was heated in a thermodrying oven. As a result, the copper paste shrunk and hardened while containing the zinc particles. The hardening conditions were a temperature of 160° C. and a treatment time of 30 minutes. FIG. 6D (hardening) illustrates the state after the hardening.

A cream solder paste 47' was adhered by screen printing to the collector electrode on which the zinc particles were scattered (FIG. 6E).

In this case, the cream solder paste 47' also contained a-flux 46 and ITO as the electrode formation surface had a poor wettability with respect to solder. Therefore, when the structure was heated up to 220° C. in an infrared heating oven, as shown in FIG. 6F (heat melting), a solder 47 concentrated toward the conductive paste with a high solder wettability, and the zinc particles 45 on the conductive paste adsorbed the solder material 47, forming a thick solder layer on the conductive paste.

Figure 6G:
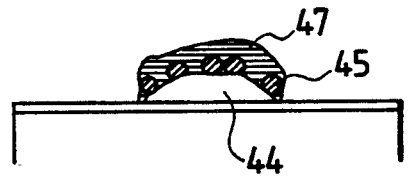
Figure 6D:
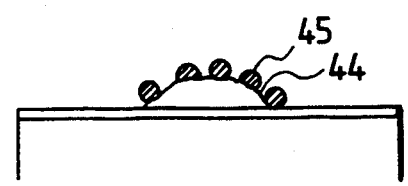

Lastly, the flux 46 that oozed out was washed away with hot water, and the resultant structure was dried to complete the manufacturing steps (FIG. 6G).

It was confirmed that a collector electrode 100 μm in width and 40 μm in average thickness could be manufactured with a high precision by the above procedures. It was also confirmed that the use of the cream solder paste further improved the evenness of the thickness of the solder layer.

EXAMPLE 11

In this example, a collector electrode was formed following the same procedures as in Example 10 except that silver particles with a particle size of 30 to 70 μm were used as the conductive powder.

As in Example 10, it was also confirmed in this example that a collector electrode 100 μm in width and 40 μm in average thickness could be manufactured with a high precision.

EXAMPLE 12

In this example, a collector electrode was formed following the same procedures as in Example 10 except that copper particles 30 to 70 μm in particle size were used as the conductive powder and a material prepared by mixing scaly silver particles with a particle size of 3 to 5 μm and spherical silver particles with a particle size of 1 to 2 μm into an epoxy resin was used as the conductive paste.

As in Example 10, it was also confirmed in this example that a collector electrode 100 μm in width and 40 μm in average thickness could be manufactured with a high precision.

EXAMPLE 13

A method of manufacturing a photovoltaic device with the arrangement shown in FIG. 4 will be described below with reference to FIGS. 7A to 7G.

Figure 7A:
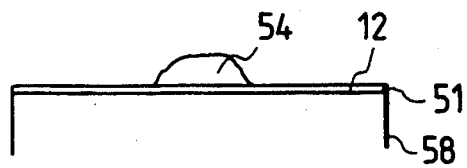
FIGS. 7A to 7G are schematic sectional views for explaining a process of manufacturing a photovoltaic device according to Example 13 of the present invention.

FIG. 7A illustrates a screen printing step in which a conductive paste 54 was adhered to the electrode formation surface of a photovoltaic device. In this example, a material prepared by dispersing silver particles with a particle size of 3 to 5 μm in an epoxy resin was used as the conductive paste, and a metal plate consisting of a 300-mesh stainless steel gauze and having an aperture ratio of 60% and an emulsion thickness of 15 μm was used as the screen plate. The result was a conductive paste pattern with a line width of 100 μm and a thickness of 20 to 30 μm.

Figure 7E:
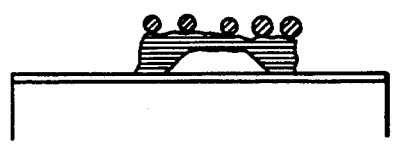
Figure 7B:

FIG. 7B shows a conductive paste hardening step in which the conductive paste 54 was heated at 160° C. for 30 minutes in a thermodrying oven of a forced circulation type. By this heating treatment, the conductive paste shrunk to have a thickness of 15 to 20 μm.

Figure 7F:
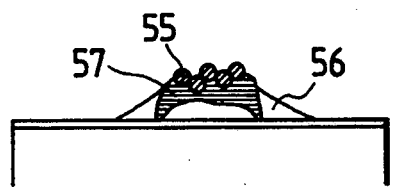
Figure 7C:
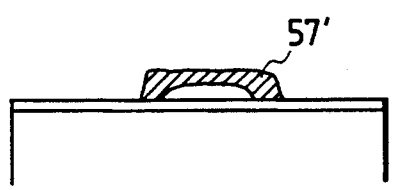

FIG. 7C shows a cream solder paste printing step. In this example, a solder paste consisting of fine solder particles of an Sn63%Pb35%Ag2% eutectic alloy was printed by using a metal plate. The metal plate used was formed by etching a printing pattern on a 100-μm thick metal plate. A cream solder layer 57' with a width of 150 to 200 μm was so formed as to cover the hardened conductive paste by using a cream solder paste containing fine solder particles 1 to 50 μm in particle size.

Figure 7G:
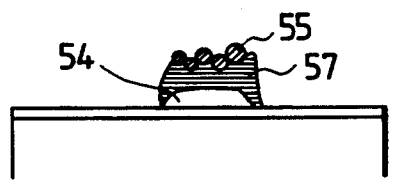
Figure 7D:
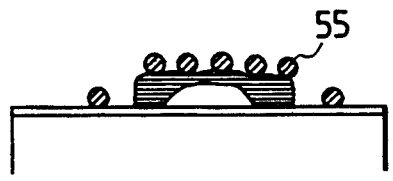

FIG. 7D illustrates a step of spraying conductive particles 55, in which gold particles 55 with a particle size of 0.1 to 100 μm were scattered to adhere to the cream solder layer 57' by a dried air flow. A flux material or a thixotropic material, for example, was added to the cream solder paste in order to obtain viscosity, and the gold particles adhered to the cream solder as shown in FIG. 7D.

FIG. 7E illustrates a step of removing the excess gold particles remaining in portions except for the cream solder layer, that was performed in the conductive powder particle spraying step. In this step, the air flow or the like used in the spraying step was used to blow the excess particles away. To remove the excess particles perfectly, a care must be taken so that an impurity, such as a solvent, does not adhere to the electrode formation surface in the preceding printing step. It is also important to sufficiently dry the electrode formation surface and the spraying atmosphere in spraying the conductive powder particles.

FIG. 7F (excess particles removing process) shows a cream solder paste heat-melting step in which the solder paste was heated by using an infrared heating oven. The solder paste melted and aggregated onto the conductive paste with a high solder wettability. The gold particles, on the other hand, were first repelled by the surface tension and then assembled to a central portion. Thereafter, the gold particles adapted themselves to the solder and were fixed to the surface layer of the solder with the solidification of the solder. A flux material 56 contained in the solder paste remained around a solder 57.

FIG. 7G illustrates a step of washing away the flux, in which the flux left behind on the electrode surface was washed away by shower washing using, e.g., a solvent, and the resultant structure was dried to complete the formation of the collector electrode.

The above procedures formed the collector electrode with a line width of 100 μm and an average thickness of 40 μm in which the gold particles 55 were fixed to the surface layer of the solder layer 57.

EXAMPLE 14

In this example, a collector electrode was manufactured following the same procedures as in Example 13 except that silver particles were used as the conductive powder in place of the gold particles.

As in Example 13, a collector electrode with a line width of 100 μm and an average thickness of 40 μm in which the silver particles were fixed to the surface of a solder layer was formed.

EXAMPLE 15

In this example, a collector electrode was manufactured following the same procedures as in Example 13 except that copper particles were used as the conductive power in place of the gold particles.

As in Example 13, a collector electrode with a line width of 100 μm and an average thickness of 40 μm in which the copper .particles were fixed to the surface of a solder layer was formed.

EXAMPLE 16

In this example, a collector electrode was manufactured following the same procedures as in Example 13 except that nickel particles were used as the conductive powder in place of the gold particles.

As in Example 13, a collector electrode with a line width of 100 μm and an average thickness of 40 μm in which the nickel particles were fixed to the surface of a solder layer was formed.

EXAMPLE 17

A method of manufacturing a photovoltaic device with the arrangement shown in FIG. 4 will be described below with reference to FIGS. 8A to 8F.

Figure 8A:
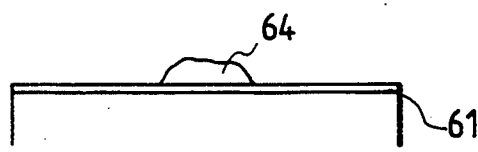
FIGS. 8A to 8F are schematic sectional views for explaining a process of manufacturing a photovoltaic device according to Example 17 of the present invention.

FIG. 8A illustrates a screen printing step in which a conductive paste 64 was adhered to the electrode formation surface of a photovoltaic device. In this example, a material prepared by dispersing copper particles with a particle size of 5 to 8 μm in a phenolic resin was used as the conductive paste 64, and a metal plate consisting of a 300-mesh stainless steel gauze and having an aperture ratio of 60% was used as the screen plate. The result was a conductive paste pattern with a line width of 100 μm and a thickness of approximately 30 μm.

Figure 8E:
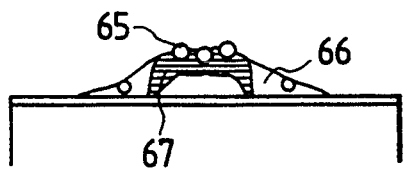
Figure 8B:

The conductive paste 64 was thermally hardened in a nitrogen atmosphere at 160° C. for 30 minutes by using a thermodrying oven (FIG. 8B). By this thermal hardening treatment, the conductive paste shrunk to have a thickness of about 20 μm. As the hardening process, a vapor phase oven in which hardening is performed in a fluorinate boiling gas can also be used.

Figure 8F:
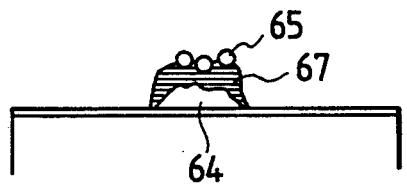
Figure 8C:
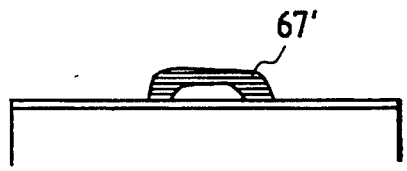

FIG. 8C shows a cream solder paste 67' printing step. In this example, screen printing-was performed by using a solder paste 67' consisting of fine solder particles 20 to 30 μm in particle size of an Sn60%Pb40% eutectic alloy. A metal plate consisting of a 200-mesh stainless steel gauze was used to form the cream solder layer 67' with a width of 150 μm so as to cover the hardened conductive paste.

Figure 8D:
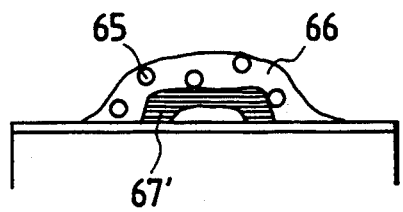
Figure 9:
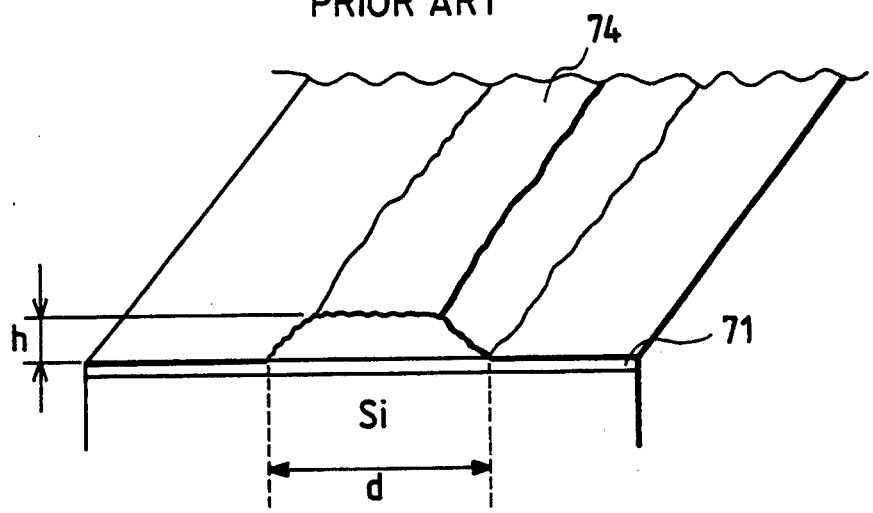
FIG. 9 is a schematic perspective view showing an example of a conventional photovoltaic device.
Figure 10:
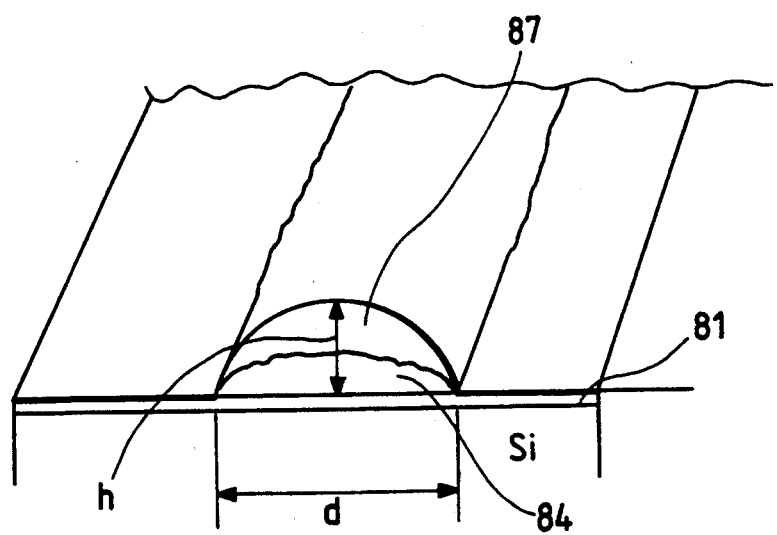
FIG. 10 is a schematic perspective view showing a practical example of a photovoltaic device.

FIG. 8D illustrates a step of spraying conductive particles, in which a material prepared by monodispersing gold particles 65 with a particle size of 0.1 to 100 μm in a flux 66 was sprayed onto the cream solder layer 67' by using a dispenser.

FIG. 8E illustrates a step of heat-melting the cream solder paste. The cream solder paste was heated by using an infrared heating reflow. The cream solder paste melted, adsorbed the gold particles 65 mixed in the flux, and solidified. The excess flux containing the excess gold particles flowed out around the electrode.

FIG. 8F illustrates a step of washing away the flux, in which the flux left behind on the electrode surface was washed away by shower washing using, e.g., a solvent, and the resultant structure was dried to complete the formation of the collector electrode.

The above procedures formed the collector electrode with a line width of 100 μm and an average thickness of 40 μm in which the gold particles 65 were fixed to the surface of the solder layer 67.

EXAMPLE 18

In this example, a collector electrode was manufactured following the same procedures as in Example 17 except that silver particles were used as the conductive powder in place of the gold particles.

As in Example 17, a collector electrode with a line width of 100 μm and an average thickness of 40 μm in which the silver particles were fixed to the surface of a solder layer was formed.

EXAMPLE 19

In this example, a collector electrode was manufactured following the same procedures as in Example 17 except that copper particles were used as the conductive powder in place of the gold particles.

As in Example 17, a collector electrode with a line width of 100 μm and an average thickness of 40 μm in which the copper particles were fixed to the surface of a solder layer was formed.

EXAMPLE 20

In this example, a collector electrode was manufactured following the same procedures as in Example 17 except that zinc particles were used as the conductive powder in place of the gold particles.

As in Example 17, a collector electrode with a line width of 100 μm and an average thickness of 40 μm in which the zinc particles were fixed to the surface of a solder layer was formed.

EXAMPLE 21

A method of manufacturing a photovoltaic device with the arrangement shown in FIG. 3 will be described below with reference to FIGS. 5A to 5G.

FIG. 5A shows an amorphous-based photovoltaic device serving as an electrode formation surface, in which an amorphous silicon-based semiconductor layer 32 and a transparent conductive film 31 are formed on a stainless steel substrate 33. The transparent conductive film in this example is 64-nm thick ITO.

Since the specific resistance of ITO is high, approximately $1 \times 10^{-3}$ Ω·cm, as compared with those of metals, a collector electrode is formed on it by using a polymer paste material consisting of silver with a relatively low specific resistance.

As shown in FIG. 5B, a pattern of a silver polymer paste 34 containing silver particles 1 to 5 μm in particle size was screen-printed on the transparent conductive layer 31 by using a printing plate consisting of a 400-mesh stainless steel gauze and having an emulsion thickness of 10 μm. Under these conditions, a pattern with a line width of 100 μm and a thickness of about 30 μm was formed. Note that the thickness became about 20 μm after thermal hardening.

Subsequently, metal particles 35 containing gold with a particle size of about 0.1 to 100 μm were sprayed onto the electrode formation surface. FIG. 5C illustrates this state. The metal particles 35 thus sprayed adhere not only to the polymer paste 34 but to the transparent conductive film 31, so an air flow was blown to blow away the metal particles except for those on the polymer paste. Thereafter, the resultant structure was dried in the air at 160° C. The polymer paste shrunk and hardened while containing the metal particles. FIG. 5D illustrates this state.

Subsequently, a flux 36 was coated on the overall electrode formation surface (FIG. 5E).

The electrode formation surface coated with the flux was gradually dipped into a molten solder tank while being heated, and was kept dipped in the tank for 10 to 30 seconds. Thereafter, the electrode formation surface was slowly pulled up while being heated and was then gradually cooled, thereby forming a solder layer on the polymer paste. Coating the flux can improve the wettability of the polymer paste and the metal particles with respect to the solder and can further prevent completely the adhesion of the solder to the electrode formation surface where no polymer paste is present.

FIG. 5F shows the electrode formation surface after dipped into the solder tank, in which state a solder layer 37 was formed on the polymer paste 34 and a large amount of the flux 36 remained on the electrode formation surface. The residual flux was washed away by shower washing using hot water. After the washing, the resultant structure was dried to complete the formation of the collector electrode (FIG. 5G).

It is necessary to perform the washing because the flux also contains the residual metal particles which are not removed by the air flow and, if the flux is either acidic or alkaline, it may corrode the transparent conductive film or block incident light when left behind.

It was confirmed that a low-resistance collector electrode having an average thickness of 40 $\mu$m regardless of its small line width of 100 $\mu$m could be manufactured with a high precision through the above procedures.

EXAMPLE 22

Example 22 of the present invention will be described below with reference to FIGS. 6A to 6G.

FIGS. 6A to 6G show electrode formation steps using cream solder. Referring to FIG. 6A, a pattern 44 was formed by Using a copper paste prepared by monodispersing copper particles 5 to 20 $\mu$m in particle size into a phenolic resin. FIG. 6A also illustrates a transparent conductive film ITO 41 and an amorphous silicon-based semiconductor layer 42 serving as a photovoltaic layer. In this structure, an electrode formation surface is the surface of the ITO film 41.

First, a copper paste line with a line width of about 100 $\mu$m was formed on the surface washed and dried well by using a screen printing machine.

Subsequently, as shown in FIG. 6B, gold particles 45 were sprayed onto the electrode formation surface. In this case, the gold particles were sprayed while being scattered across the whole electrode formation surface.

An air flow was flowed horizontally with respect to the electrode formation surface on which the gold particles were scattered, removing the gold particles except for those on the polymer paste so that the gold particles were left behind only on the polymer paste. FIG. 6C shows this state.

Subsequently, the resultant structure was heated in a thermodrying oven. As a result, the copper paste shrunk and hardened while containing the gold particles. The hardening conditions were a temperature of 160° C. and a treatment time of 30 minutes. FIG. 6D illustrates the state after the hardening.

A cream solder 47' was adhered by screen printing to the collector electrode on which the gold particles were scattered (FIG. 6E).

In this case, the cream solder paste 47' also contained a flux 46 and ITO as the electrode formation surface had a poor wettability with respect to solder. Therefore, when the structure was heated up to 220° C. in an infrared heating oven, as shown in FIG. 6F, the solder 47 concentrated toward the conductive paste with a high solder wettability, and the gold particles on the conductive paste adsorbed the solder material, forming a thick solder layer on the conductive paste.

Lastly, the flux 46 that oozed out was washed away through hot water washing or the like, and the resultant structure was dried to complete the manufacturing steps (FIG. 6G).

It was confirmed that a collector electrode 100 $\mu$m in width and 40 $\mu$m in average thickness could be manufactured with a high precision by the above procedures. It was also confirmed that the use of the cream solder paste further improved the evenness of the thickness of the solder layer.

EXAMPLE 23

Figure 11:
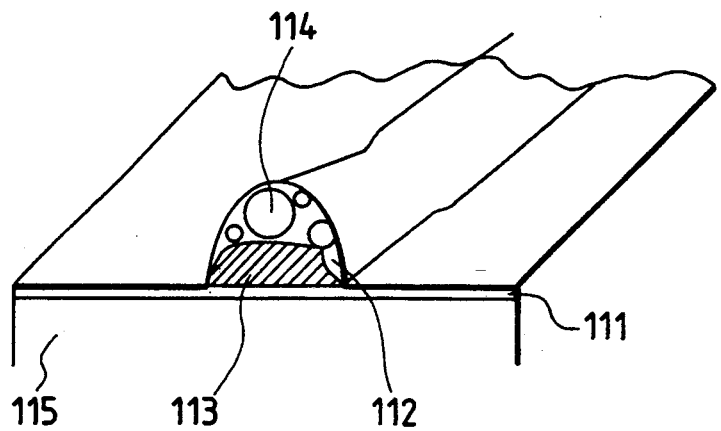
FIG. 11 is a perspective view showing the main part of a photovoltaic device according to Example 23 of the present invention.
Figure 23:
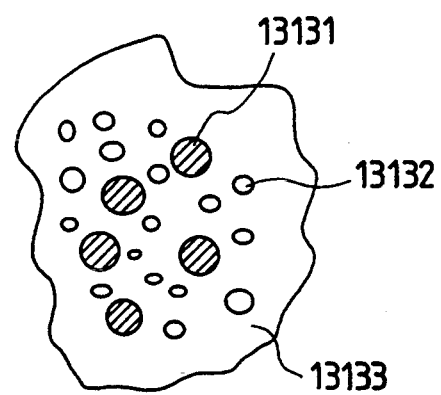
FIG. 23 is a schematic sectional view showing a solder paste shown in FIG. 22.

FIG. 11 shows a photovoltaic device according to Example 23 of the present invention. Referring to FIG. 23, a conductive paste 113 prepared by monodispersing silver particles 114 about 1 to 5 $\mu$m in particle size in an epoxy resin was formed on an ITO transparent conductive film 111 serving as an electrode formation surface. The conductive paste 113 was adhered in the form of a line with a line width of about 100 $\mu$m by a screen printing machine using a 400-mesh SUS screen plate with an emulsion thickness of 10 $\mu$m. A semiconductor silicon layer 115 is also illustrated in FIG. 11.

Thereafter, the resultant structure was hardened at 160° C. for 15 minutes, and a solder paste 112 as a low-melting metal was again adhered to have a line width of approximately 150 $\mu$m to the electrode formation surface by using a metal plate. The resultant structure was then heated by hot-air heating, subjected to flux cleaning, and dried.

Figure 12:
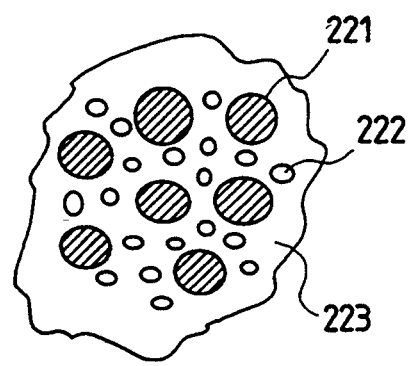
FIG. 12 is a schematic sectional view showing a solder paste shown in FIG. 11.

FIG. 12 shows the details of the solder paste 112. The solder paste 112 consists of silver particles 221 with a particle size of 50 to 100 $\mu$m and a composite phase, i.e., fine solder particles 222 as a low-melting metal phase consisting of an Sn62%Pb36%Ag2% eutectic alloy and having a particle size of 20 to 30 $\mu$m, and a flux and a thixotropic material 223 as a melting agent phase.

The weight ratio of the silver particles 221 to the fine solder particles 222 was 3 to 35 wt %. After being heated, the solder paste 112 assembled together with the silver particles on the linear conductive paste 113 hardened as described above, forming a thick solder layer.

The silver particles 221 are taken up into the solder during heat melting of the solver material but prevented from penetrating into the undercoating solder paste. Even if silver is melted into the solder, a relatively even solder layer can be formed because the change in flowability of the solder is small.

EXAMPLE 24

Figure 13:
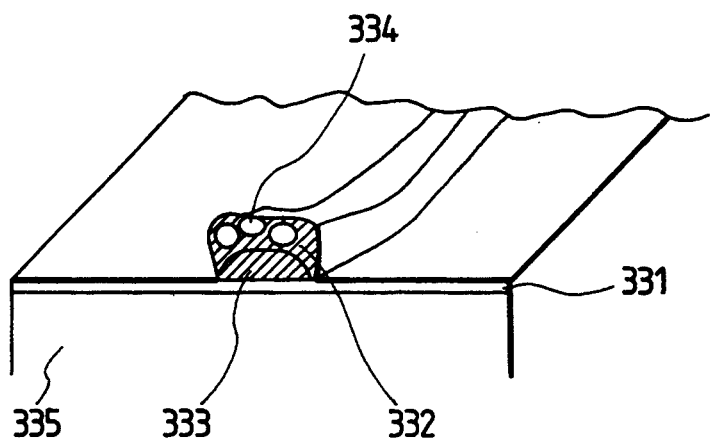
FIG. 13 is a perspective view showing the main part of Example 24.

FIG. 13 shows Example 24 of the present invention, in which an Sn-Ag solder paste 332 was used as a low-melting metal. Although the Sn-Ag solder material has a melting temperature higher by about 40° C. than that of the Sn-Pb solder used in Example 21, the volume resistivity of an Sn95%Ag5% solder material is $1.23 \times 10^{-5}$ $\Omega$·cm while that of an Sn62%Pb36%Ag2% solder material is $1.57 \times 10^{-5}$ $\Omega$·cm. Therefore, the resistivity can be improved by about 20% compared to Example 22. Referring to FIG. 13, a device comprises a transparent conductive film 331, a bound conductive member 333 formed from a silver paste, silver particles 334, and a semiconductor layer 335.

Figure 14:
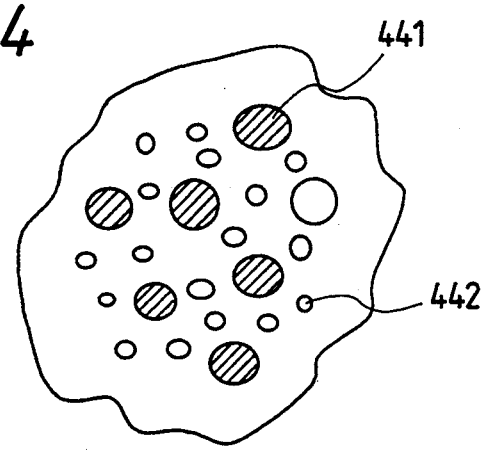
FIG. 14 is a schematic sectional view showing a solder paste shown in FIG. 13.

FIG. 14 illustrates the sectional structure of the Sn-Ag solder paste consisting of Ag particles 441 and Sn95%Ag5% eutectic alloy particles 442.

Note that the silver particles 334 were singly used as metal particles in each of the above examples, but the silver particles can also be used together with other metal particles, such as copper, gold, and nickel particles. In addition, the metal particles are not limited to spherical particles as in this example but may be scaly particles, needle-like particles, or those having a composite shape of these shapes. Furthermore, the particle sizes of the metal particles need not be uniform.

The conductive paste serving as the undercoating layer is not limited to a silver paste but may be a copper paste using copper particles. A calcined paste using a glass frit or the like as a binder in place of a resin is also usable. As the solder material, it is possible to use Pb-group, In-group, and Au-group solder materials as well as the Sn-Pb and Sn-Ag solder materials. Examples of a combination with Ag are Pb-Ag and In-Ag solder materials.

Although the hot-air drying oven was used in the solder melting process in this example, the same process can be performed by using, e.g., a hot plate or a VPS (vapor phase process). If the fine metal particles have magnetism, the flowability of solder can be further suppressed by applying a high magnetic field during heat melting. To control the flowability, needle-like or scaly metal particles can also be used in addition to spherical particles.

EXAMPLE 25

Figure 15:
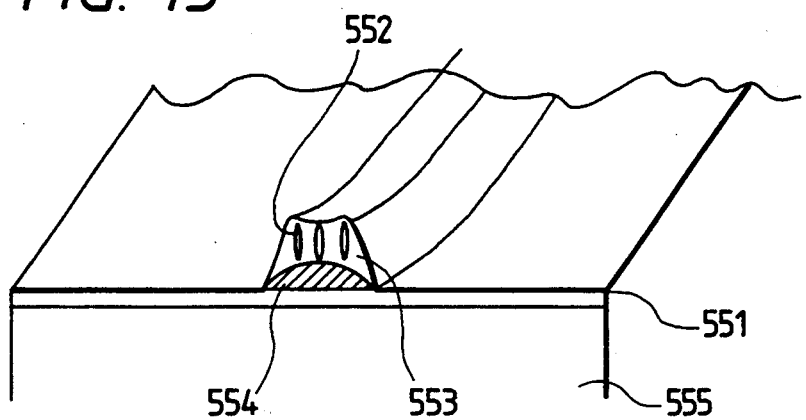
FIG. 15 is a perspective view showing the main part of Example 25.

FIG. 15 shows a portion around a collector electrode of a photovoltaic device according to Example 25 of the present invention. In this example, a conductive paste 554 prepared by monodispersing copper particles in a phenolic resin was adhered to a transparent conductive film 551 on a semiconductor layer 555 by screen printing. The particle size of the copper particles used was about 5 to 10 μm, and the screen plate consisted of 300-mesh SUS (stainless steel) and had an emulsion thickness of about 15 μm. In this example, a collector electrode with a line width of 100 μm and a thickness of approximately 15 to 20 μm could be formed.

Figure 16:
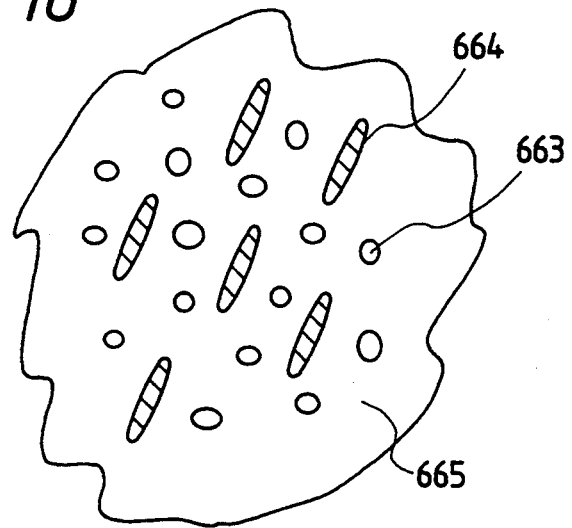
FIG. 16 is a sectional view showing a solder paste shown in FIG. 15.

The bound conductive member 554 was formed by thermal hardening performed in an oxygen-free atmosphere by using a heating machine, such as a vapor phase reflow oven. A solder layer was formed on the conductive member 554. In this example, as shown in FIG. 16, needle-like nickel particles 664 were dispersed at a weight ratio of about 3% to 20% in fine Sn60%Pb40% solder particles 663 which were 30 to 50 μm in diameter. A flux and a thixotropic material 665 for controlling the viscosity of a solder paste 553 were buried around the particles 663 and 664.

The solder paste 553 was printed on the undercoating layer consisting of the conductive member 554 by using, e.g., a metal plate about 100 μm thick.

Figure 17:
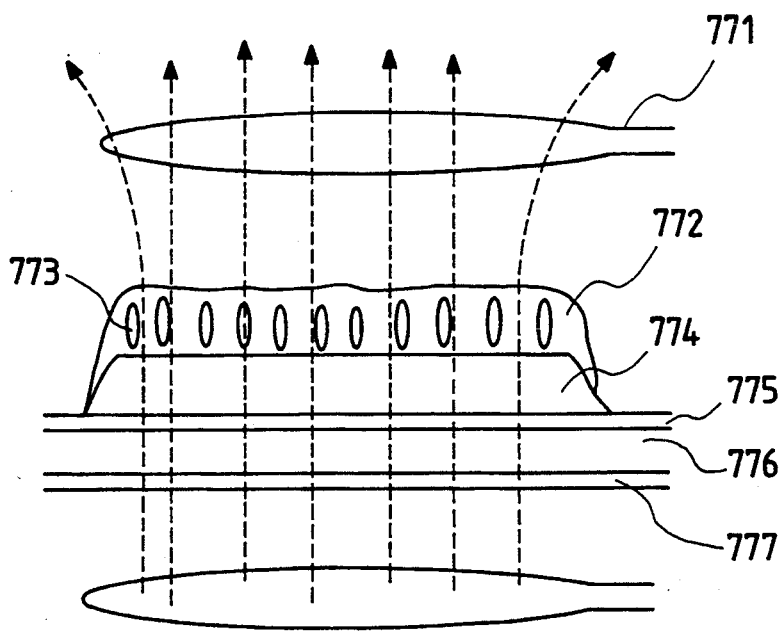
FIG. 17 is a side view for explaining a heating step performed in a magnetic field according to Example 25.

In this example, as shown in FIG. 17, the device is heated by, e.g., infrared heating in a high magnetic field generated by a magnetic field generating coil 771. In a solder paste 772 heated in the high magnetic field, the molten solder increases its flowability, and nickel particles 773 as a ferromagnetic metal dispersed in the solder easily pull up the molten metal in the direction of the magnetic field under the influence of the increased flowability. In addition, since the nickel particles 773 have a solder wettability, they adsorb the molten solder to raise the solder layer as a whole. The raised electrode was then gradually cooled and fixed while being raised by the solder which lost its flowability.

Referring to FIG. 17, the device comprises a transparent conductive film 775, a bound conductive member 774 having copper particles, an amorphous silicon semiconductor 776 as a semiconductor layer, and a stainless steel substrate 777.

EXAMPLE 26

Figure 18:
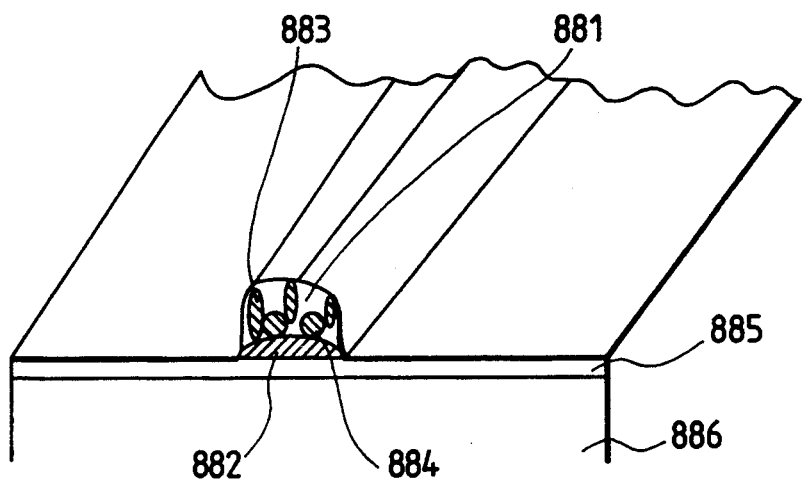
FIG. 18 is a perspective view showing the main part of Example 26.

FIG. 18 illustrates Example 26 of the present invention. In this example, a bound conductive member 882 was formed on a transparent conductive film 885 on a semiconductor layer 886, and a small amount of copper particles 884 as a high conductive metal were mixed in addition to nickel particles 883 as the ferromagnetic metal in a solder paste 881 as a low-melting metal. The copper particles 884 function to decrease the volume resistivity, thereby decreasing the volume resistance of the electrode.

Figure 19:
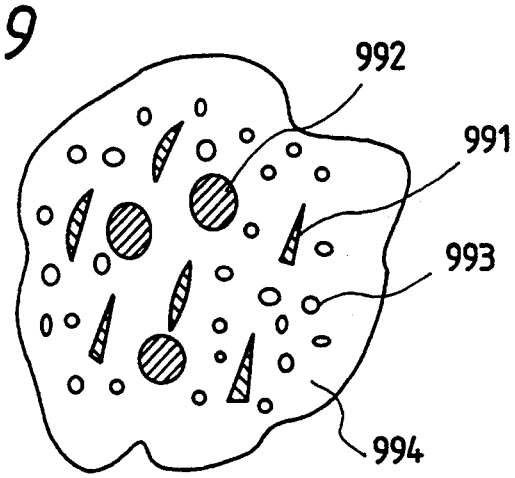
FIG. 19 is a schematic sectional view showing a solder paste shown in FIG. 18.

In this embodiment, as shown in FIG. 19, nickel particles 991 as metal particles consisting of a magnetic material dispersed in the solder paste 881 were formed to have a needle-like shape. The nickel particles, however, need not be needle-like particles but may be spherical particles, such as copper particles 992, or scaly particles, or may have a composite shape of these shapes. The material to be added together with the magnetic material is not limited to copper but may be, e.g., silver or iron. In addition, a solder material 993 need not be the Sn-Pb solder material but may be an Sn-Ag or In-Ag solder material. FIG. 19 also illustrates a flux and a thixotropic material, such as those used in Example 22, generally denoted by reference numeral 994.

EXAMPLE 27

Figure 20:
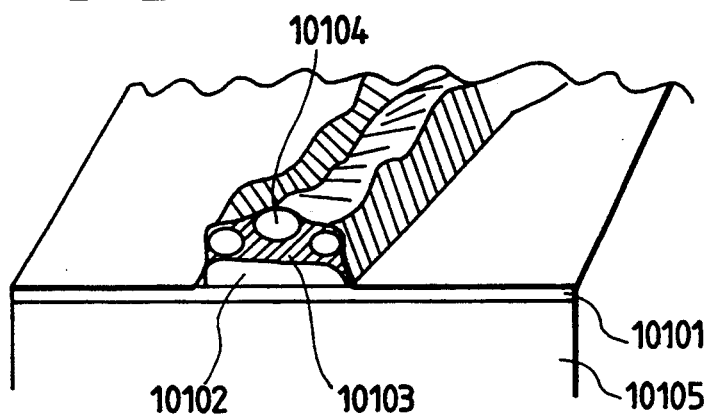
FIG. 20 is a perspective view showing the main part of Example 27.

FIG. 20 shows Example 27 of the present invention. In this example, a bound conductive member 10102 as a conductive paste having copper particles, prepared by monodispersing copper particles 5 to 10 μm in particle size in a phenolic resin, was screen-printed to have a line width of approximately 100 μm on a transparent electrode 10101 on a semiconductor layer 10105 and then thermally hardened in an oxygen-free atmosphere. Copper particles 10104 contained in a solder paste 10103 were repelled by the transparent conductive film 10101 and aggregated together with the heat-melted solder on the conductive paste 10102. As shown in FIG. 20, the copper particles 10104 adsorbed the solder on their surfaces to rise on the bound conductive member 10102 and coagulated after being cooled.

Figure 21:
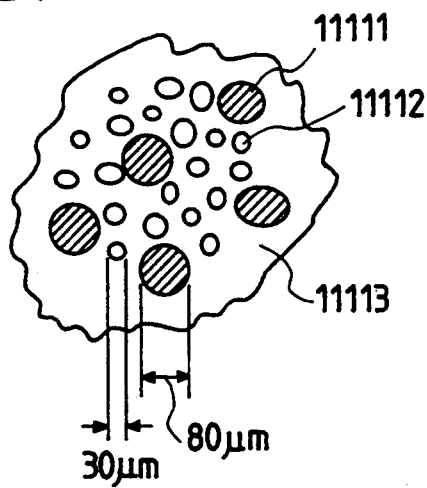
FIG. 21 is a schematic sectional view showing a solder paste shown in FIG. 20.

FIG. 21 shows the details of the cream solder paste 10103 raised on the bound conductive member 10102 having the copper particles. The solder paste 10103 was printed to have a line width of about 200 μm by using a metal plate and thermally hardened by an infrared heating flow.

The solder paste shown in FIG. 21 was prepared by monodispersing copper particles 11111 about 80 μm in particle size in a mixture of fine solder particles 11112 consisting of an Sn63%Pb37% eutectic alloy and having a particle size of approximately 30 μm and a rosin-based flux 11113. The mixing ratio of the fine solder particles 11112 to the copper particles 11111 was 2 to 30 wt %. In principle, as the content of the copper particles 11111 increases, the surfaces become rough although the resistivity decreases, and finally most of the solder is adsorbed on the surfaces of the copper particles to increase the voids, thereby degrading the mechanical strength.

EXAMPLE 28

Figure 22:
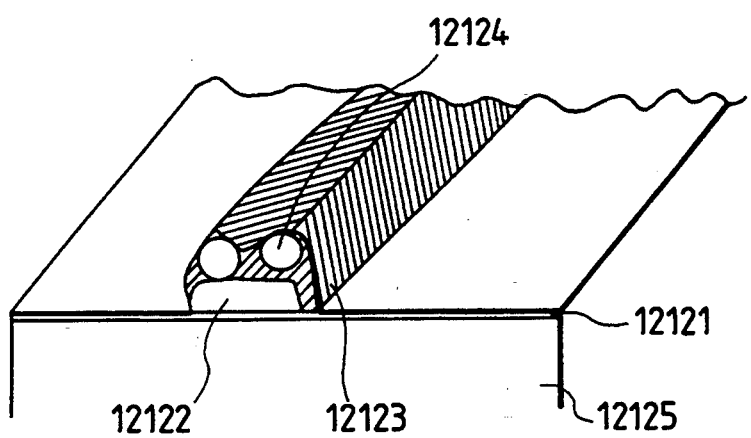
FIG. 22 is a perspective view showing the main part of Example 28.

FIG. 22 shows Example 28 according to the present invention. In this example, a silver paste 12122 which is hardened more easily than and superior in printing properties to a copper paste was formed as a conductive paste to have a line width of about 100 μm on an ITO film 12121 on a semiconductor 12125 by screen printing. The silver paste 12122 was prepared by monodispersing scaly particles about 1 to 2 μm in particle size in an epoxy resin. This paste material could be hardened in the air at 150° C. for about 15 minutes. FIG. 22 also illustrates a cream solder 12123 and copper particles 12124.

FIG. 23 shows the details of the cream solder 12123. To prevent silver from being taken up into the solder, fine Sn62%Pb36%Ag2% solder particles 13132 prepared by eutectic-alloying silver were used, and, in the same manner as in Example 25, copper particles 13131 with a particle size of about 80 μm were monodispersed at a ratio of 3 to 30 wt %. The cream solder 12123 was printed to have a line width of approximately 150 to 200 μm by using a metal plate or the like and coagulated by heating at 220° C. to 250° C.

In addition to the arrangements of Examples 27 and 28, it is also possible to use, as the undercoating layer, a material prepared by monodispersing fine particles of a metal, other than copper and silver, which has a high wettability with respect to a solder material. Usable examples of such a metal are nickel, iron, palladium, and gold. In situations where a treatment at a relatively high temperature is possible, a calcined paste prepared by mixing the above metal material and a glass frit is also usable. The solder material is also not limited to the Sn-Pb solder material but may be an Sn-Ag or In-Ag solder material. In addition, spherical, needle-like, and scaly metal particles are also applicable.

EXAMPLE 29

Figure 24A:
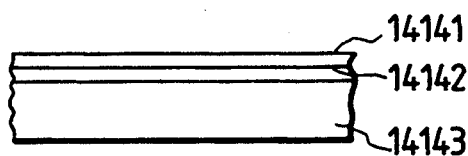
FIGS. 24A to 24F are sectional views showing the manufacturing steps of Example 29.

FIGS. 24A to 24F illustrate the steps of manufacturing a photovoltaic device according to Example 29 of the present invention. This example relates to the manufacture of an amorphous photovoltaic device. As shown in FIG. 24A, an amorphous semiconductor layer 14142 was formed on a stainless steel substrate 14143. An electrode formation surface was on the light incident side, and the amorphous semiconductor layer 14142 as a photovoltaic layer had a high electrical resistance. Therefore, the surface of the amorphous semiconductor layer 14142 was covered with a thin transparent electrode (ITO) 14141, and the volume resistivity of the layer 14142 was $1 \times 10^{-3}$ to $2 \times 10^{-4}$ Ω·cm.

It is impossible to solder an electrode directly to the transparent conductive film 14141 because ITO is an oxide and hence has no wettability with respect to solder. Since, therefore, an undercoating electrode agent serving as a portion for soldering is required in order to form a thick collector electrode, a metal film was formed on the transparent conductive film 14141 by vapor deposition. FIG. 24B shows this vapor deposition step. Referring to FIG. 24B, the transparent conductive film 14141 was patterned in advance through a metal mask 14144, and evaporated metal particles were adhered to the transparent conductive film 14141 by electron beam heating or resistance heating, thereby forming a metal film 14145.

As the metal particles to be vapor-deposited, nickel having good adhesion properties with respect to ITO and a high solder wettability was used. FIG. 24C shows a step after the mask 14144 was removed, in which the metal collector electrode 14145 about 1 μm thick could be formed on the electrode formation surface. The manufacturing cost is extremely increased when vapor deposition is adopted because the film formation rate of vapor deposition is low. In this example, however, since a very thin film is used as a portion for soldering, no major problem arises in terms of manufacturing cost.

Figure 24D:
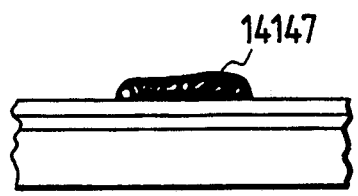
Figure 24B:
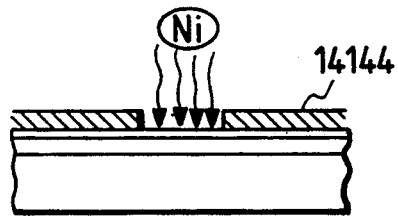

As shown in FIG. 24D, a cream solder material 14147 was adhered by screen printing to the metal film 14145 formed as a portion for soldering. In this case, the printing precision of the Cream solder is not as strict as that of the metal film 14145 consisting of nickel. As an example, when the line width of the nickel electrode 14145 is 100 μm, the cream solder can be printed with a margin extending by about 100 μm on each of the left and right sides.

Figure 24E:
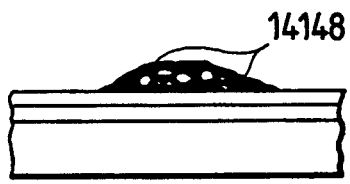
Figure 24C:
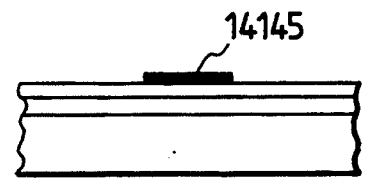

Subsequently, as shown in FIG. 24E, the cream solder 14147 adhered to the nickel electrode 14145 was heat-melted at 180° C. to 240° C. by an infrared heating reflow or in a vapor phase oven. In this heat melting, the nickel electrode 14145 with a high solder wettability aggregated by the surface tension, and at the same time the solder material and the copper particles present outside the nickel electrode 14145 were attracted onto the nickel electrode. The copper particles thus moved onto the nickel electrode 14145 rose on the nickel electrode to form a thick collector electrode 14146 while suppressing the flowability of the molten solder, preventing the solder from assembling into a ball on a portion of the electrode.

Figure 24F:
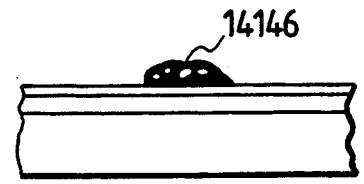

A flux material and a thixotropic material 14148 contained in the cream solder remained on the surface of the solder or around the solder. If this material 14148 is left behind, it may contaminate the surface owing to its intrinsic properties to thereby interfere with incident light or may deteriorate the reliability of a product under high-temperature, high-humidity conditions. Therefore, the resultant structure was shower-washed with, e.g., an organic solvent, such as a modified alcohol or Cellosolve, and then dried (FIG. 24F).

Figure 25A:
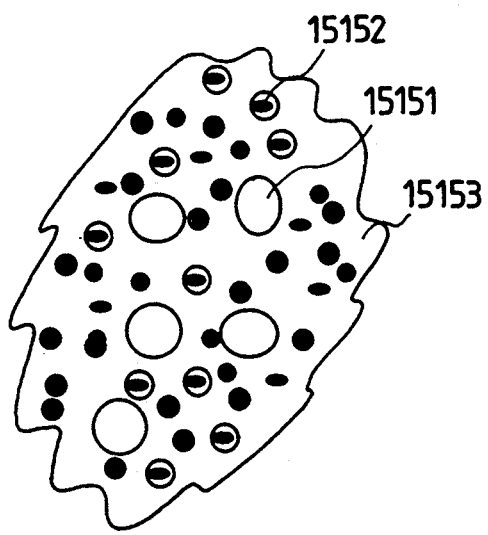
FIGS. 25A, 25B and 25C are schematic sectional views showing solder pastes according to Examples 29, 30, and 31, respectively.

The cream solder 14147 had a composition and an arrangement as shown in FIG. 25A. Referring to FIG. 25A, copper particles 15151 with a particle size of about 50 to 100 μm were dispersed at a weight ratio of 5% to 25% with respect to Sn-Pb (Sn63%:Pb37%) solder particles 15152 about 5 to 30 μm in particle size. A flux as a binder and a thixotropic material 15153 as a pasting agent for controlling viscosity were blended between the solder particles 15152 and the copper particles 15151. This makes it possible to print the cream solder easily by using the screen printing. In addition to the cream solder shown in FIG. 25A, those shown in FIGS. 25B and 25C can be used.

EXAMPLE 30

Figure 25B:
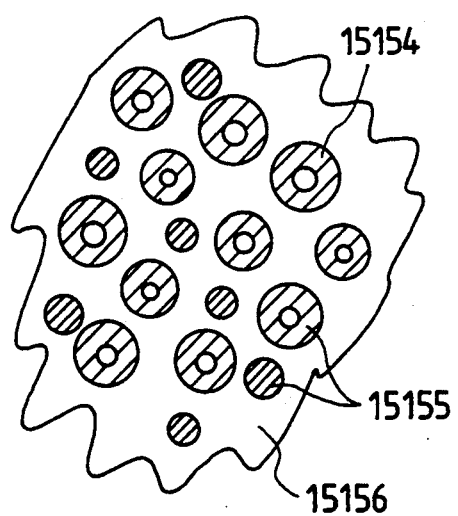

FIG. 25B shows Example 30 of the present invention, in which copper particles 15154 are covered with Sn63%Pb37% solder 15155. In this arrangement, the range of wt % of copper can be widened to about 3 to 40 wt % although the diameters of the individual particles are increased by the solder covering them to cause a disadvantage in printing properties.

EXAMPLE 31

Figure 25C:
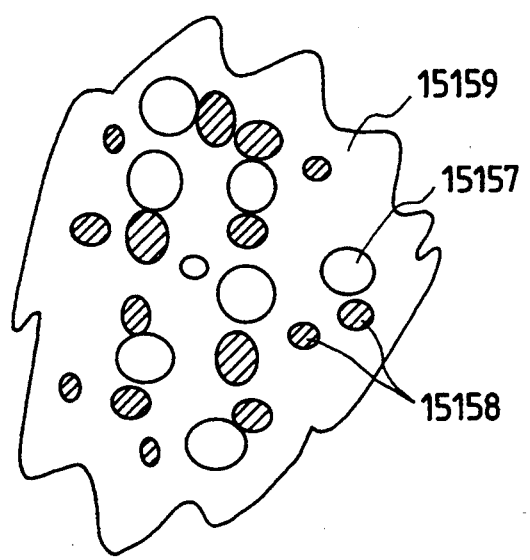

FIG. 25C shows Example 31 of the present invention, in which Sn-Pb solder 15158 is not only dispersed as particles in a paste but in part bound to copper particles 15157. In this arrangement, the copper particles adapt themselves to the solder particles rapidly in melting.

The shape of these particles is not limited to a sphere, and any of Sn-Ag, Pb-group, Au-group, and In-group solder materials can also be used in addition to the Sn-Pb solder material.

EXAMPLE 32

Figure 26A:
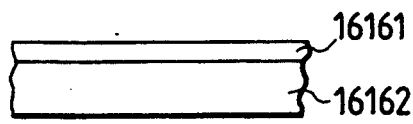
FIGS. 26A to 26G are sectional views showing the manufacturing steps of Example 32.
Figure 26B:
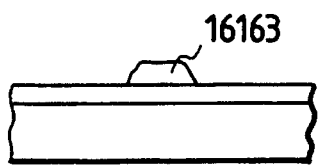
Figure 26C:
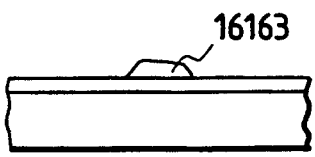

FIGS. 26A to 26G illustrate the steps of manufacturing a photovoltaic device according to Example 32 of the present invention. This example relates to the manufacture of a polycrystalline solar cell. The electrode formation surface of this polycrystalline solar cell is a p-type silicon substrate 16161 (FIG. 26A) with a relatively high electrical conductivity, but solder as a collector electrode cannot be formed directly on the substrate 16161 as in Example 27. Therefore, a calcined paste 16163 normally used in a thick-film hybrid IC or the like was used to form an undercoating electrode by screen printing to be described below (FIG. 26B).

The calcined paste 16163 mainly consisted of silver particles about 3 to 10 μm in diameter and further added with a glass frit as a binder and a thixotropic material for controlling the viscosity of the paste. The pattern of the calcined paste 16163 can be formed easily by screen printing.

In the screen printing, widths around 100 μm can be easily realized by using the state-of-the-art techniques. In this example, therefore, an undercoating electrode with a line width of 80 to 100 μm was patterned using a 325-mesh screen plate with an aperture ratio of 60% available from Tokyo Process Service. The grass frit contained in the paste melts at 500° C. to 900° C. in about 30 minutes, making formation of an electrode with a resistance of approximately $5 \times 10^{-6}$ to $8 \times 10^{-6}$ Ω·cm possible. However, it becomes difficult to form a thick electrode as the line width of the electrode decreases.

Figure 26D:
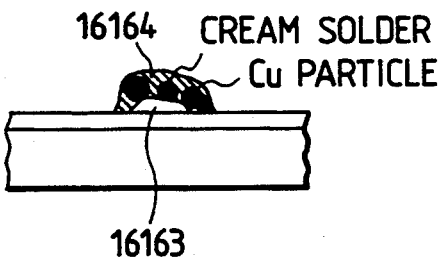

For this reason, after calcining was performed by heating (FIG. 26C), a cream solder 16164 was printed following the same procedures as in Example 29 (FIG. 26D). The printing was performed by using a metal plate with a film thickness of 100 μm.

Thereafter, when the resultant structure was heated at about 180° C. to 250° C., the molten solder aggregated onto the calcined paste while containing the metal particles, and the metal particles suppressed the flowability of the molten metal, forming a thick collector electrode.

Figure 26E:
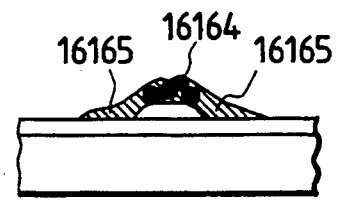

FIG. 26E illustrates the state after the heat-melting described above was performed. Referring to FIG. 26E, a flux and a thixotropic material 16165 remained on the surface of and around the collector electrode 16164.

Figure 26F:
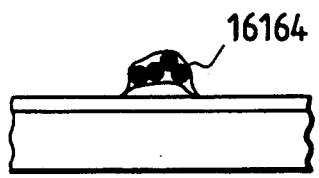

FIG. 26F shows a step of washing away the flux and the thixotropic material 16165. In this step, shower washing was performed by using an organic solvent, such as a modified alcohol or Cellosolve, or hot water.

Figure 26G:
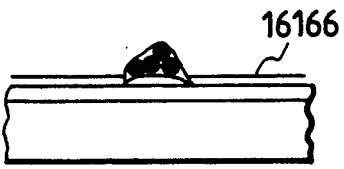
Figure 27:
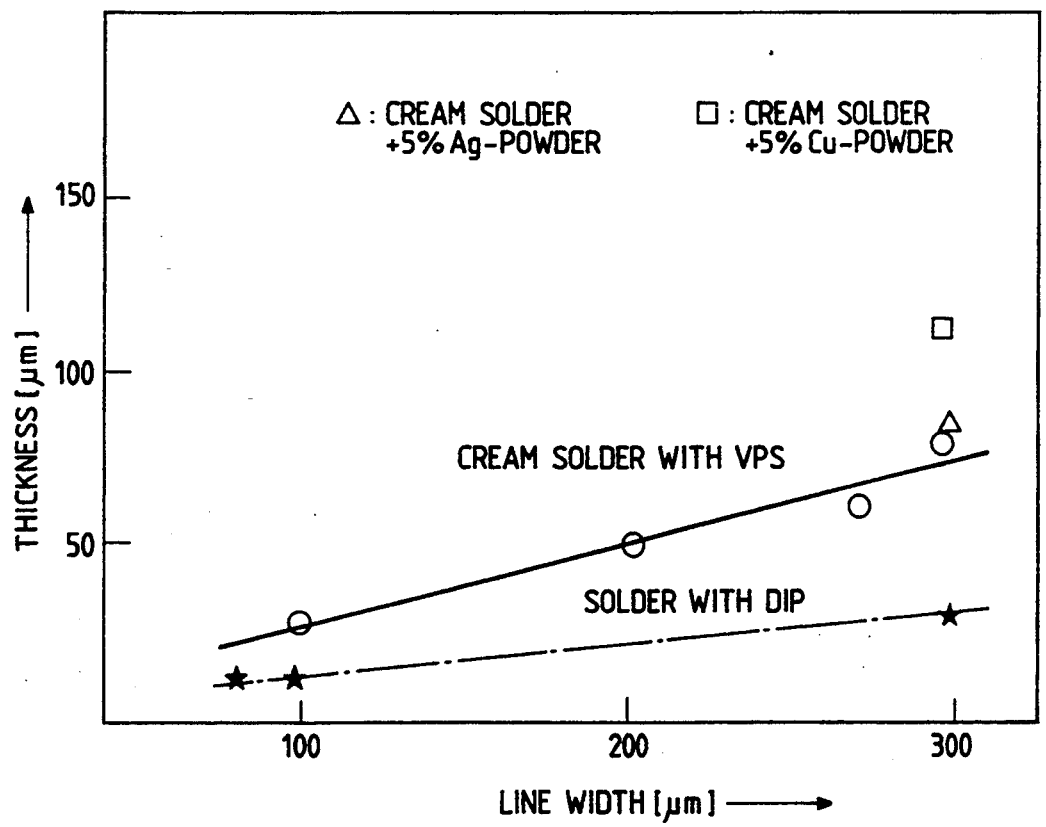
FIG. 27 is a graph showing the relationship between the line width and the thickness of a collector electrode.
Figure 29:
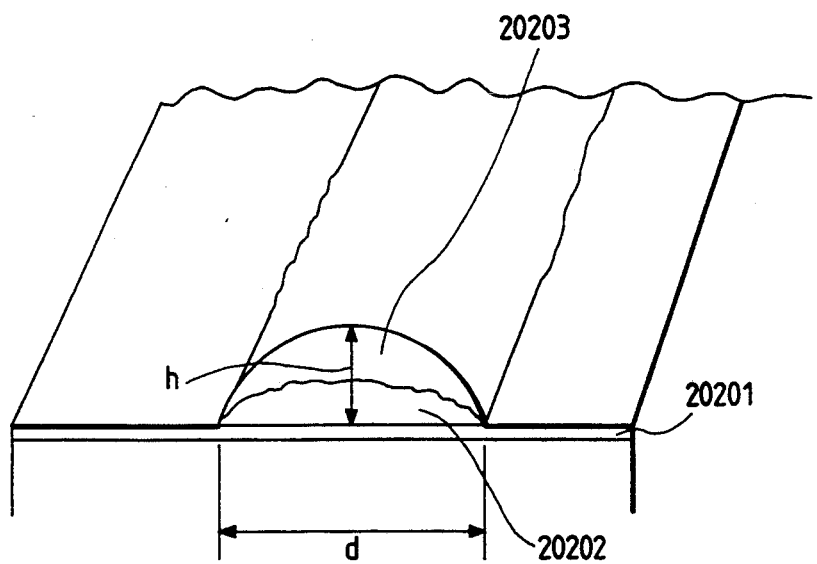
FIG. 29 is a perspective view showing the main part of the photovoltaic device shown in FIGS. 28A to 28F.
Figure 28A:
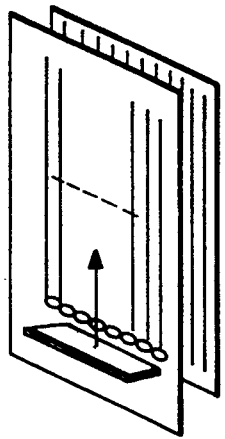
FIGS. 28A to 28F are schematic perspective views for explaining steps of manufacturing a photovoltaic device.
Figure 28B:
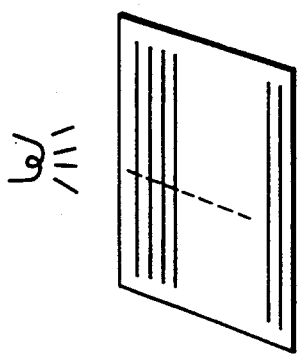
Figure 28C:
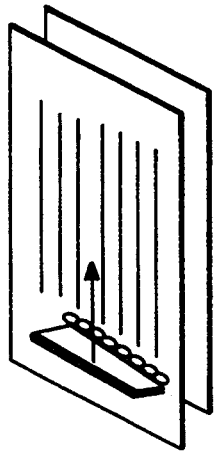
Figure 28D:
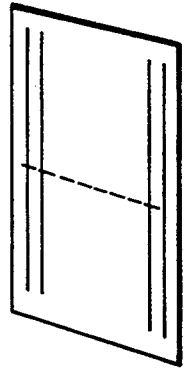
Figure 28E:
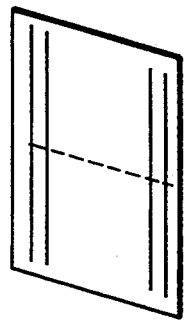
Figure 28F:
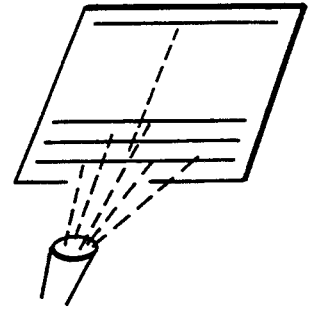

After the collector electrode was formed as described above, an antireflection film 16166 was coated on the entire electrode formation surface to prevent reflection (FIG. 26G). Any example of the present invention was superior to the conventional examples.

According to the present invention, a collector electrode having a large thickness regardless of its small line width can be formed. This consequently, largely decreases the resistance of the collector electrode, making it possible to provide a photovoltaic device with a high photoelectric conversion efficiency at a low cost.

According to the present invention, aggregates of metal particles relatively close to one another can be formed in the vicinity of the top portion of a low-melting metal layer. As a result, the resistance of a collector electrode can be further decreased, so there can be provided a photovoltaic device with a high photoelectric conversion efficiency. In addition, since the resistance is stable over a long time period, it is possible to provide a photovoltaic device with a high conversion efficiency, in which a decrease in output with time is small.

According to the present invention, a thick solder material can be formed on an electrode, and this decreases the resistance loss of the electrode material. In addition, the flowability of a magnetic material contained in a paste material increases when the paste material is heat-melted, so the thickness of a solder layer or variations in the thickness can be controlled by applying a high magnetic field. That is, the magnetic metal particles with a high solder adsorptivity tend to form a thick solder layer under the influence of the magnetic field, and the solder loses its flowability when cooled in this magnetic field, forming a photovoltaic device electrode having a solder layer with a considerable thickness. Consequently, a fine, low-resistance electrode can be formed on a photovoltaic device, and this increases the module efficiency of the device.

Furthermore, according to the present invention, a sufficiently large thickness can be maintained even when the line width is decreased. Therefore, a loss caused by blocking of light and a resistance loss can be reduced, and thereby the module conversion efficiency of a photovoltaic device can be effectively improved.

What is claimed is:

1. A photoelectric converting device comprising:
a semiconductor for performing photoelectric conversion; and
a collector electrode formed on said semiconductor, wherein said collector electrode comprises (a) a bound conductive member composed of at least conductive particles and a polymer binder, and (b) a metal member composed of (i) a low-melting metal which is a metal, an alloy or a mixture of said metal and said alloy and (ii) a conductive powder contained in said low-melting metal and having a higher melting point than that of said low-melting metal, said metal member covering said bound conductive member and electrically connected to said bound conductive member and wherein said conductive powder is present on a surface or in the vicinity of a surface of said bound conductive member and is distributed in said metal member predominantly toward the side of the bound conductive member.

2. A device according to claim 1, wherein said metal member covers a portion on said bound conductive member except for a junction surface between said bound conductive member and said semiconductor.

3. A device according to claim 1, wherein said conductive particles are composed of not less than two types of metal materials.

4. A device according to claim 3, wherein at least one type of a metal material of said conductive particles composed of not less than two types of metal materials is localized on a surface or in the vicinity of a surface of each conductive particle.

5. A device according to claim 4, wherein the amount of said metal material localized on a surface or in the vicinity of a surface of said conductive particles is reduced toward an interior of each conductive particle.

6. A device according to claim 1, wherein said conductive powder is selected from the group consisting of tin, lead, palladium, zinc, silver, copper, a copper alloy, gold, and nickel.

7. A device according to claim 1, wherein said conductive powder is present on a surface or in the vicinity of a surface of said low-melting metal.

8. A device according to claim 1, wherein the melting point of said conductive powder is higher by not less than 100° C. than that of said low-melting metal.

9. A device according to claim 1, wherein said low-melting metal is a eutectic alloy.

10. A device according to claim 9, wherein said conductive powder has wettability with respect to said eutectic alloy.

11. A device according to claim 10, wherein said conductive powder having wettability is a ferromagnetic metal powder.

12. A device according to claim 1, wherein said metal member is solder primarily composed of Sn, Pb, or In.

13. A device according to claim 1, wherein said metal member is composed of Cu.

14. A device according to claim 1, wherein said conductive particles are primarily composed of Cu, Sn, Pb, Ni, Ag, Pb, or Au, and said metal member is solder primarily composed of Sn, Pb, or In.

15. A device according to claim 1, further comprising a transparent conductive film between said semiconductor and said collector electrode.

16. A device according to claim 1, wherein said semiconductor is amorphous silicon.

* * * * *